United States Patent
Lu et al.

(10) Patent No.: US 9,985,046 B2
(45) Date of Patent: May 29, 2018

(54) METHOD OF FORMING A STAIRCASE IN A SEMICONDUCTOR DEVICE USING A LINEAR ALIGNMENT CONTROL FEATURE

(71) Applicant: SANDISK TECHNOLOGIES LLC, Plano, TX (US)

(72) Inventors: Zhenyu Lu, Milpitas, CA (US); Jixin Yu, Milpitas, CA (US); Koji Miyata, Yokkaichi (JP); Makoto Yoshida, Yokkaichi (JP); Johann Alsmeier, San Jose, CA (US); Hiro Kinoshita, Yokkaichi (JP); Daxin Mao, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/180,902

(22) Filed: Jun. 13, 2016

(65) Prior Publication Data

US 2017/0358594 A1    Dec. 14, 2017

(51) Int. Cl.
  *H01L 27/115* (2017.01)
  *H01L 27/11582* (2017.01)
  (Continued)

(52) U.S. Cl.
  CPC .. *H01L 27/11582* (2013.01); *H01L 21/31105* (2013.01); *H01L 21/76801* (2013.01);
  (Continued)

(58) Field of Classification Search
  CPC ............. H01L 27/11582; H01L 23/528; H01L 21/76801; H01L 23/544; H01L 23/5226;
  (Continued)

(56) References Cited

U.S. PATENT DOCUMENTS 5,915,167 A    6/1999  Leedy
7,005,350 B2   2/2006  Walker et al.
(Continued)

FOREIGN PATENT DOCUMENTS

WO    WO 2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Cuong B Nguyen
*Assistant Examiner* — Samuel Park
(74) *Attorney, Agent, or Firm* — The Marbury Law Group PLLC

(57) ABSTRACT

A linear mark extending perpendicular to a primary step direction of stepped terrace for a three-dimensional memory device can be employed as a reference feature for aligning a trimming material layer before initiating an etch-and-trim process sequence. The linear mark can be formed as a linear trench or a linear rail structure. The distance between a sidewall of each trimming material layer and the linear mark can be measured at multiple locations that are laterally spaced apart perpendicular to the primary step direction to provide statistically significant data points, which can be employed to provide an enhanced control of the staircase patterning process. Likewise, locations of patterned stepped surfaces can be measured at multiple locations to provide enhanced control of the locations of vertical steps in the stepped terrace.

9 Claims, 38 Drawing Sheets

(51) Int. Cl.
  *H01L 21/66* (2006.01)
  *H01L 27/11519* (2017.01)
  *H01L 27/11565* (2017.01)
  *H01L 27/11556* (2017.01)
  *H01L 23/528* (2006.01)
  *H01L 23/522* (2006.01)
  *H01L 23/544* (2006.01)
  *H01L 21/768* (2006.01)
  *H01L 21/311* (2006.01)

(52) U.S. Cl.
  CPC ............ *H01L 22/20* (2013.01); *H01L 23/528* (2013.01); *H01L 23/5226* (2013.01); *H01L 23/544* (2013.01); *H01L 27/11519* (2013.01); *H01L 27/11556* (2013.01); *H01L 27/11565* (2013.01); *H01L 2223/54426* (2013.01)

(58) Field of Classification Search
  CPC ......... H01L 21/31105; H01L 27/11556; H01L 27/11565; H01L 27/11519; H01L 22/20; H01L 2223/54426
  See application file for complete search history.

(56) References Cited

U.S. PATENT DOCUMENTS

| | | | |
|---|---|---|---|
| 7,023,739 | B2 | 4/2006 | Chen et al. |
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,514,321 | B2 | 4/2009 | Mokhlesi et al. |
| 7,575,973 | B2 | 8/2009 | Mokhlesi et al. |
| 7,696,559 | B2 | 4/2010 | Arai et al. |
| 7,745,265 | B2 | 6/2010 | Mokhlesi et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,187,936 | B2 | 5/2012 | Alsmeier et al. |
| 8,394,716 | B2 | 3/2013 | Hwang et al. |
| 8,643,142 | B2 | 2/2014 | Higashitani et al. |
| 9,023,719 | B2 | 5/2015 | Pachamuthu et al. |
| 2007/0210338 | A1 | 9/2007 | Orlowski |
| 2007/0252201 | A1 | 11/2007 | Kito et al. |
| 2009/0230449 | A1 | 9/2009 | Sakaguchi et al. |
| 2009/0242967 | A1 | 10/2009 | Katsumata et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0001250 | A1 | 1/2012 | Alsmeier |
| 2012/0012920 | A1 | 1/2012 | Shin et al. |
| 2012/0119287 | A1 | 5/2012 | Park et al. |
| 2013/0264631 | A1 | 10/2013 | Alsmeier et al. |
| 2015/0076584 | A1 | 3/2015 | Pachamuthu et al. |
| 2015/0179660 | A1 | 6/2015 | Yada et al. |
| 2017/0103996 | A1* | 4/2017 | Lee .................. H01L 27/11556 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Kimura, "3D Cells Make Terabit NAND Flash Possible," Nikkei Electronics Asia, Sep. 17, 2009, 6pgs.
International Search Report & Written Opinion, PCT/US2011/042566, dated Jan. 17, 2012.
Invitation to Pay Additional Fees & Partial International Search Report, PCT/US2011/042566, dated Sep. 28, 2011.
International Search Report, PCT/US2013/035567, dated Sep. 30, 2013, 6pgs.
U.S. Appl. No. 14/517,134, filed Oct. 17, 2014, SanDisk Technologies Inc.
U.S. Appl. No. 14/723,868, filed May 28, 2015, SanDisk Technologies Inc.
U.S. Appl. No. 14/739,354, filed Jun. 15, 2015, SanDisk Technologies Inc.

* cited by examiner

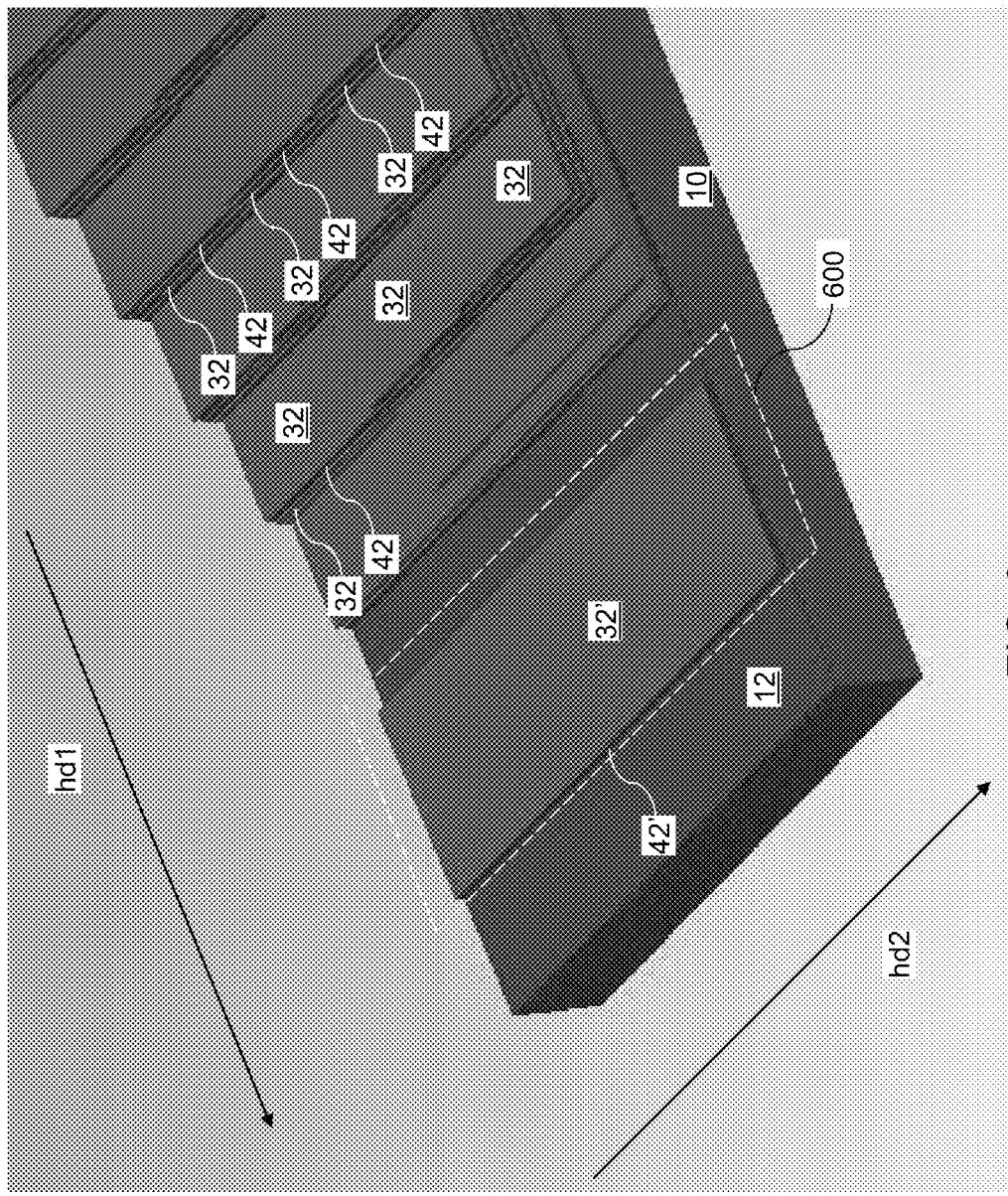

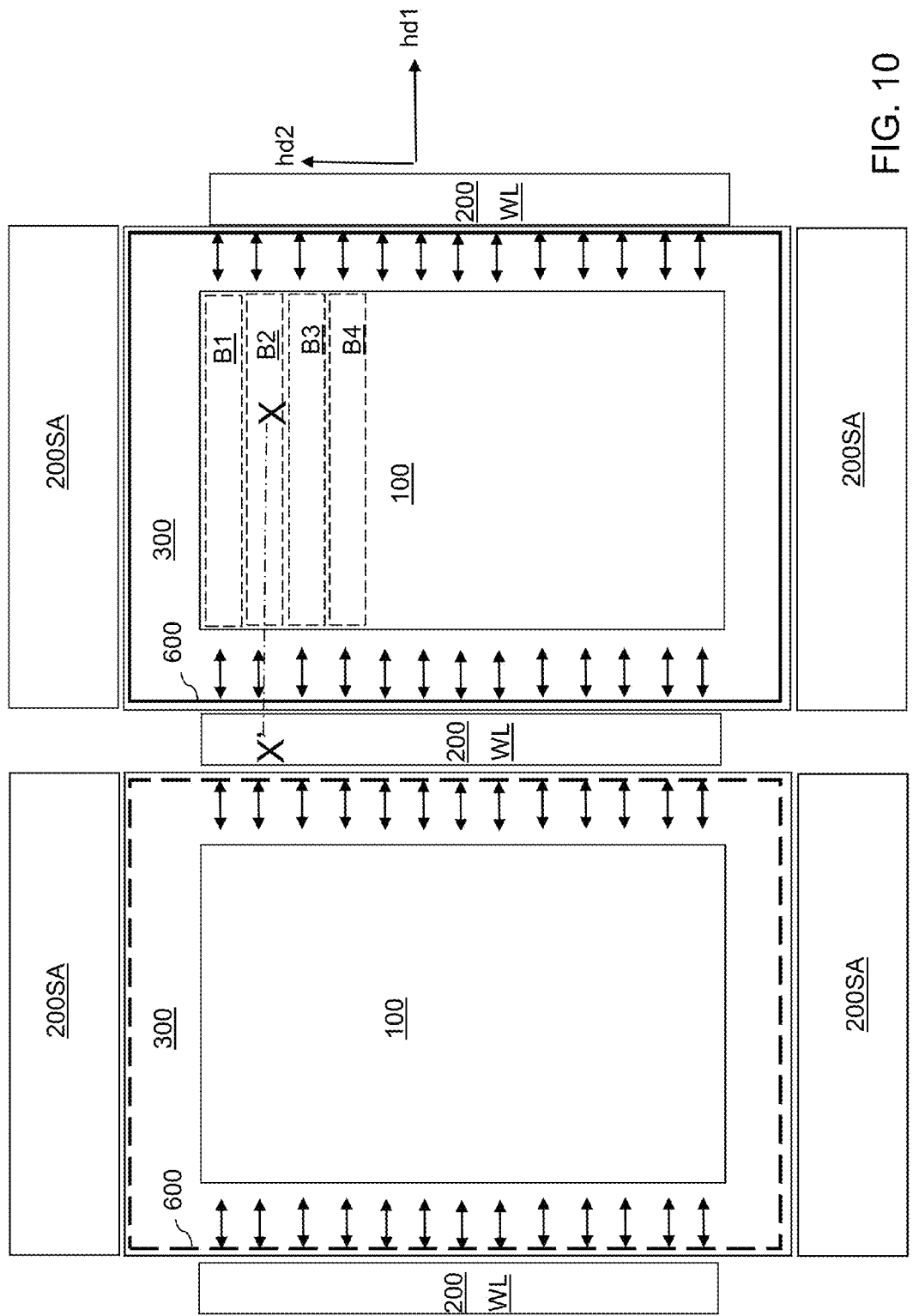

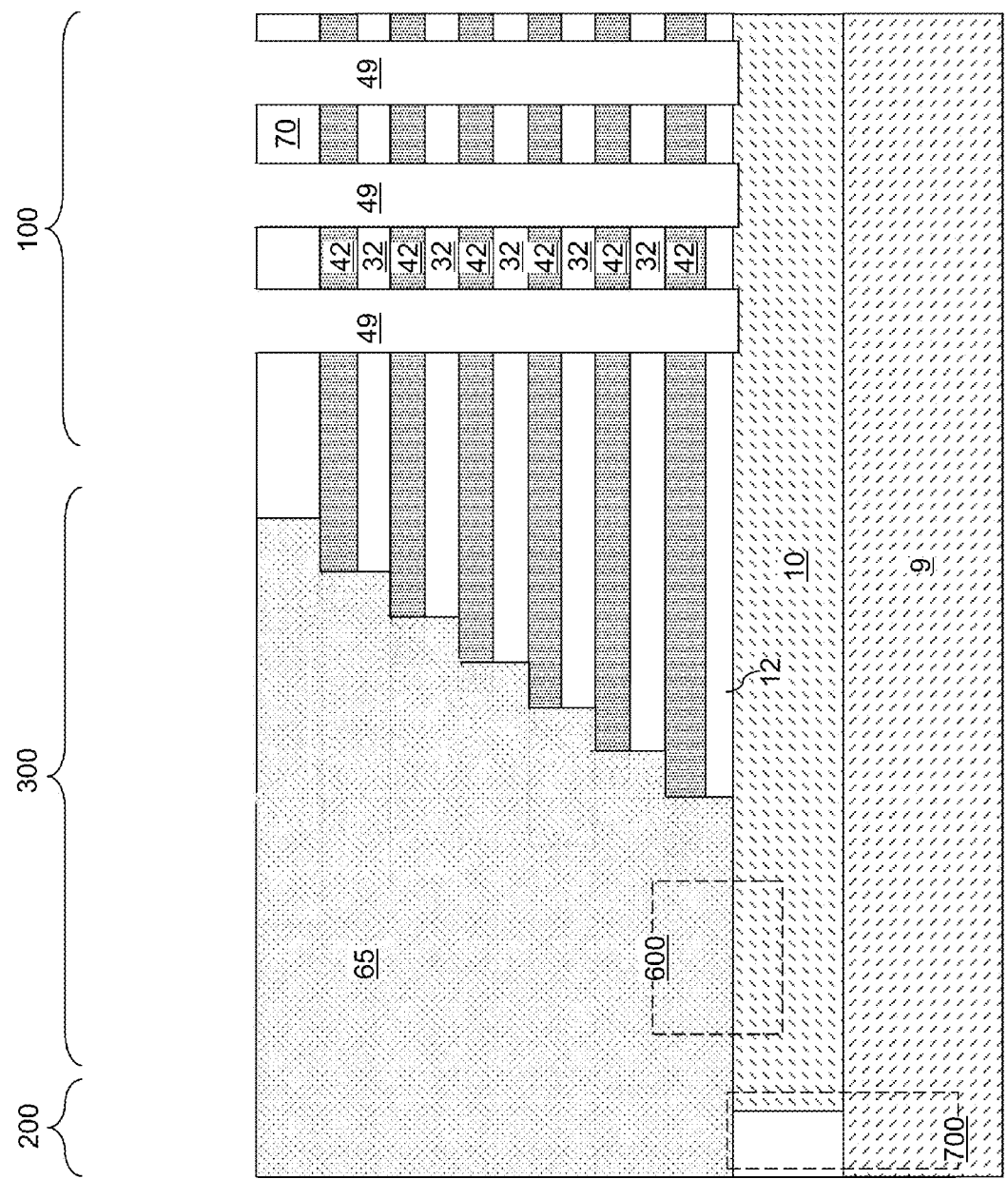

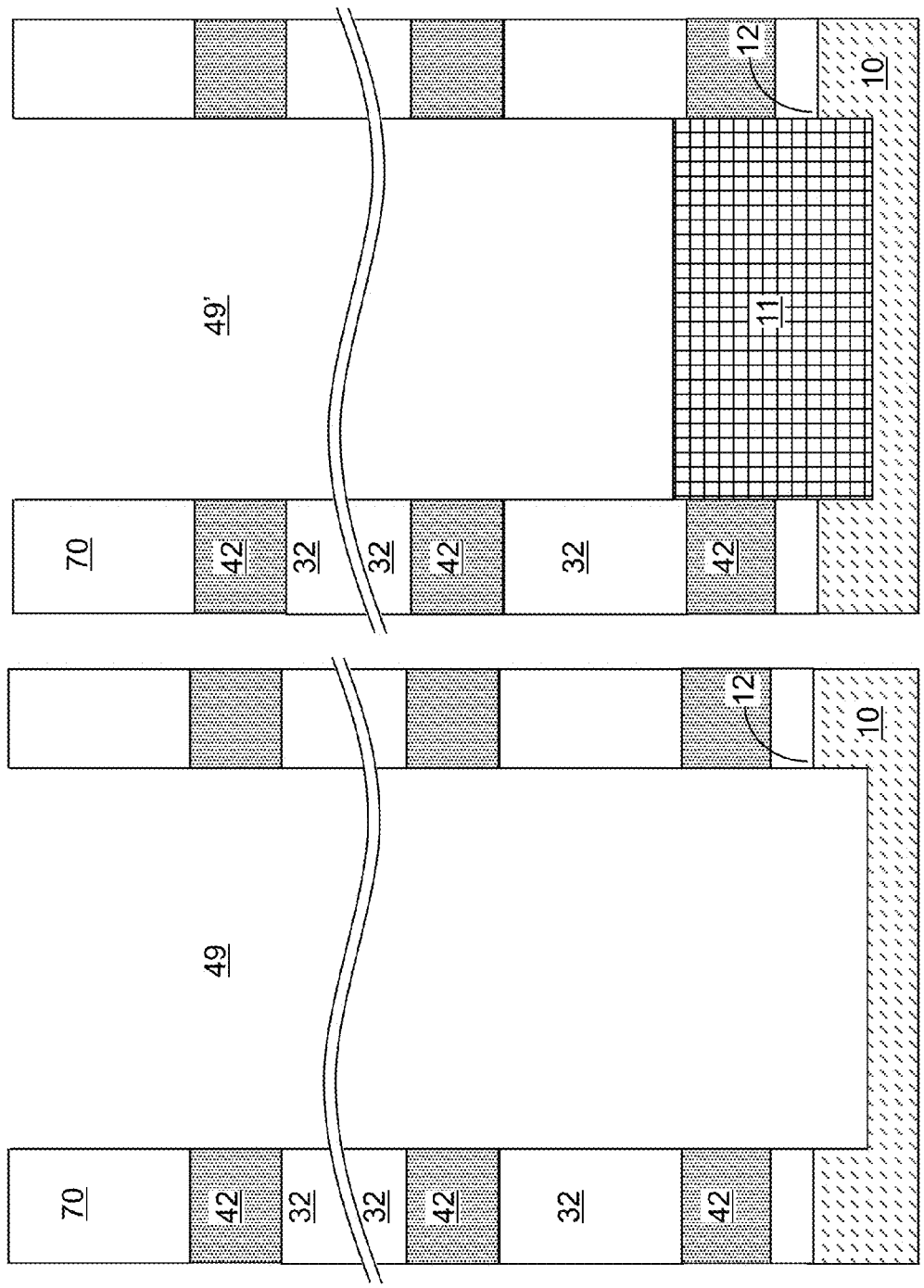

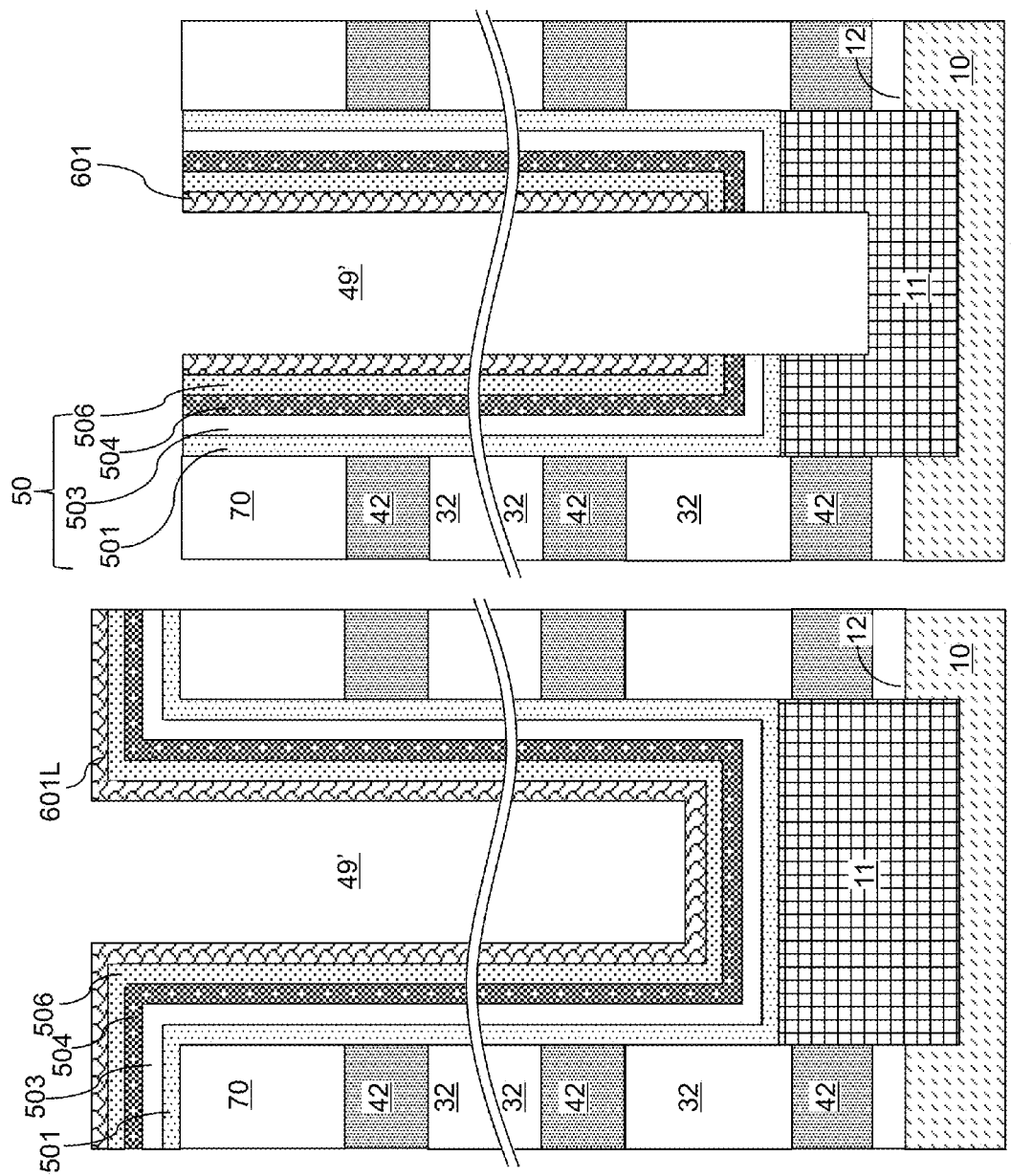

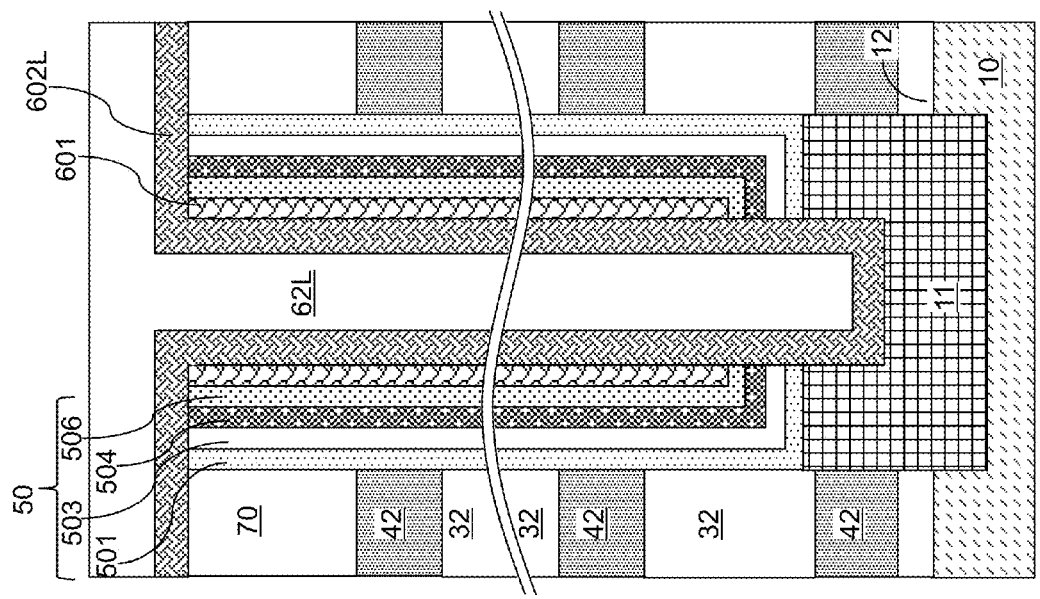
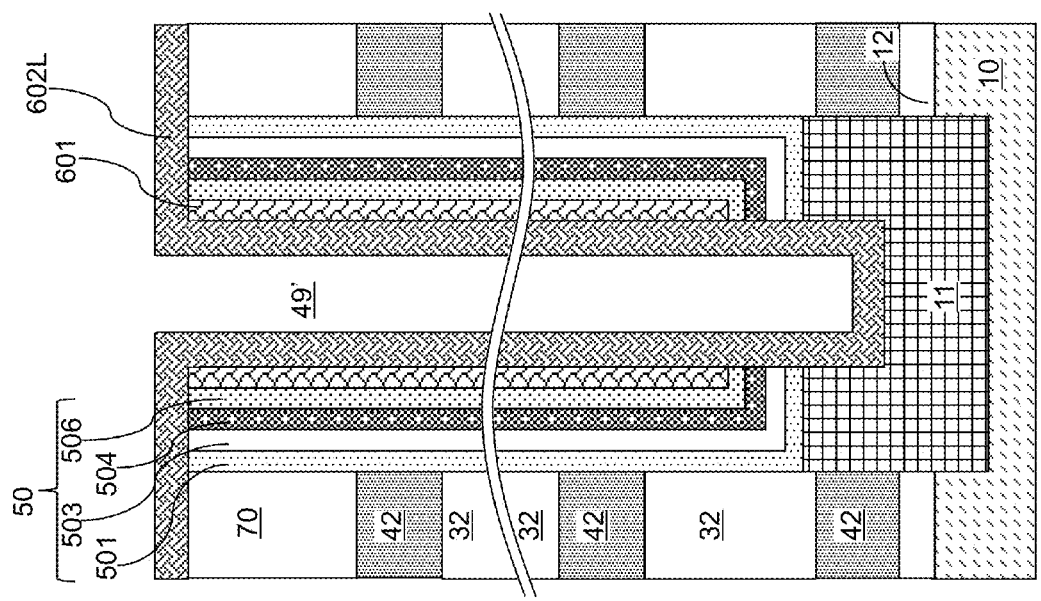

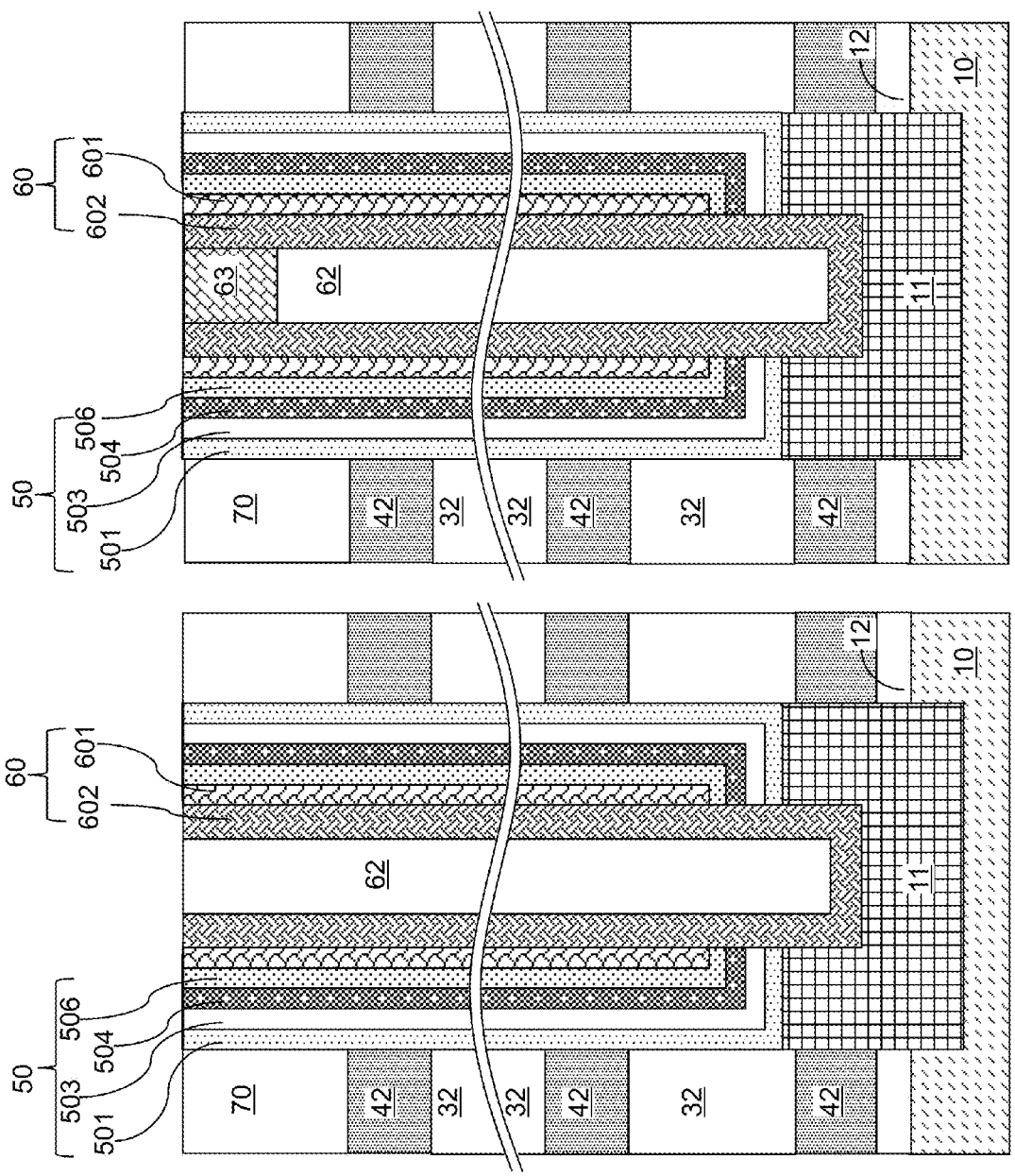

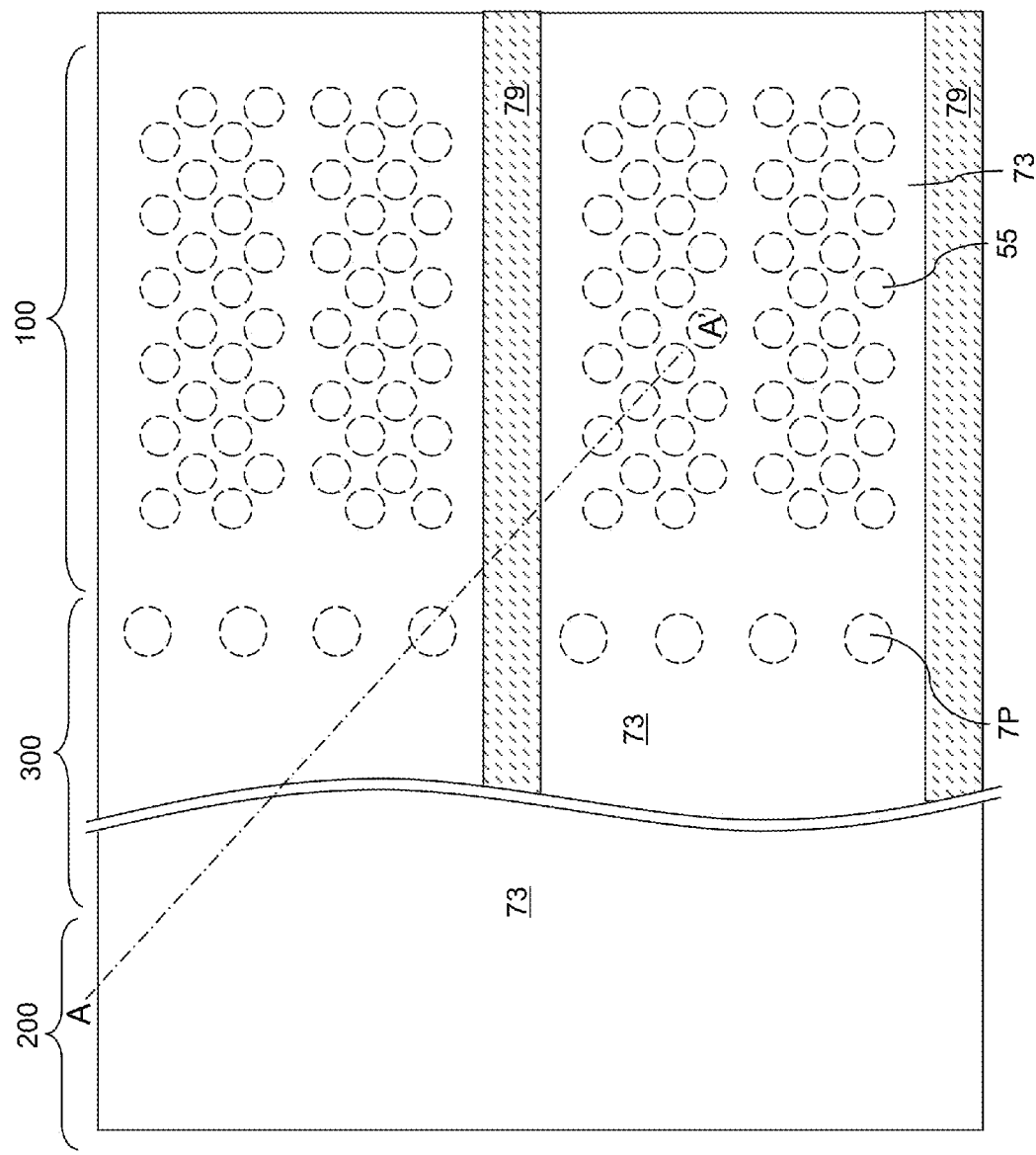

METHOD OF FORMING A STAIRCASE IN A SEMICONDUCTOR DEVICE USING A LINEAR ALIGNMENT CONTROL FEATURE

FIELD

The present disclosure relates generally to the field of semiconductor processing and specifically to a method of making three-dimensional memory devices using a linear alignment feature to pattern a staircase contact region.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a device structure is provided. An alternating stack of insulating layers and spacer material layers is formed over a substrate. A linear mark is formed through a set of layers located at an upper portion of the alternating stack, wherein the linear mark laterally extends perpendicular to a first horizontal direction and parallel to a second horizontal direction. A set of staircase-forming processing steps at least twice. The set of staircase-forming processing steps comprises: a first step of forming a trimming material layer having a sidewall that is laterally offset from the linear mark by a respective substantially uniform lateral offset distance; a second step of repeatedly performing a combination of an etch process and a trimming process, wherein each etch process transfers a pattern of the trimming material layer vertically through a set of layers within the alternating stack to form stepped surfaces, and each trimming process isotropically trims the trimming material layer; and a third step of removing a remaining portion of the trimming material layer.

According to another aspect of the present disclosure, a three-dimensional memory device is provided, which comprises an alternating stack of insulating layers and electrically conductive layers located over a substrate. The alternating stack comprises a terrace region in which each electrically conductive layer other than a topmost electrically conductive layer laterally extends farther than any overlying electrically conductive layers within the alternating stack, and the terrace region includes stepped surfaces that continuously extend from a bottommost layer within the alternating stack to a topmost layer within the alternating stack. The three-dimensional memory device further comprises memory stack structures extending through the alternating stack, each of the memory stack structures comprising a memory film and a vertical semiconductor channel, and a linear mark that laterally extends perpendicular to a first horizontal direction and parallel to a second horizontal direction, having a substantially uniform width along the first direction, and is laterally offset from a bottommost electrically conductive layer toward an opposite side of the memory stack structures.

BRIEF DESCRIPTION OF THE DRAWINGS

FIG. 9 is a perspective view of an exemplary terrace according to a second embodiment of the present disclosure.

FIG. 10 is a plan view of an exemplary structure illustrating multiple lateral offset distance measurements that can be employed during formation of a terrace according to an embodiment of the present disclosure.

FIG. 12 is a schematic vertical cross-sectional view of the exemplary structure of FIG. 11 after formation of memory openings according to an embodiment of the present disclosure.

FIGS. 13A-13H are sequential schematic vertical cross-sectional views of a memory opening within the exemplary structure during various processing steps employed to form a memory stack structure according to an embodiment of the present disclosure.

FIG. 15B is a partial see-through top-down view of the exemplary structure of FIG. 5A. The vertical plane A-A' is the plane of the schematic vertical cross-sectional view of FIG. 5A.

DETAILED DESCRIPTION

Figure 1:
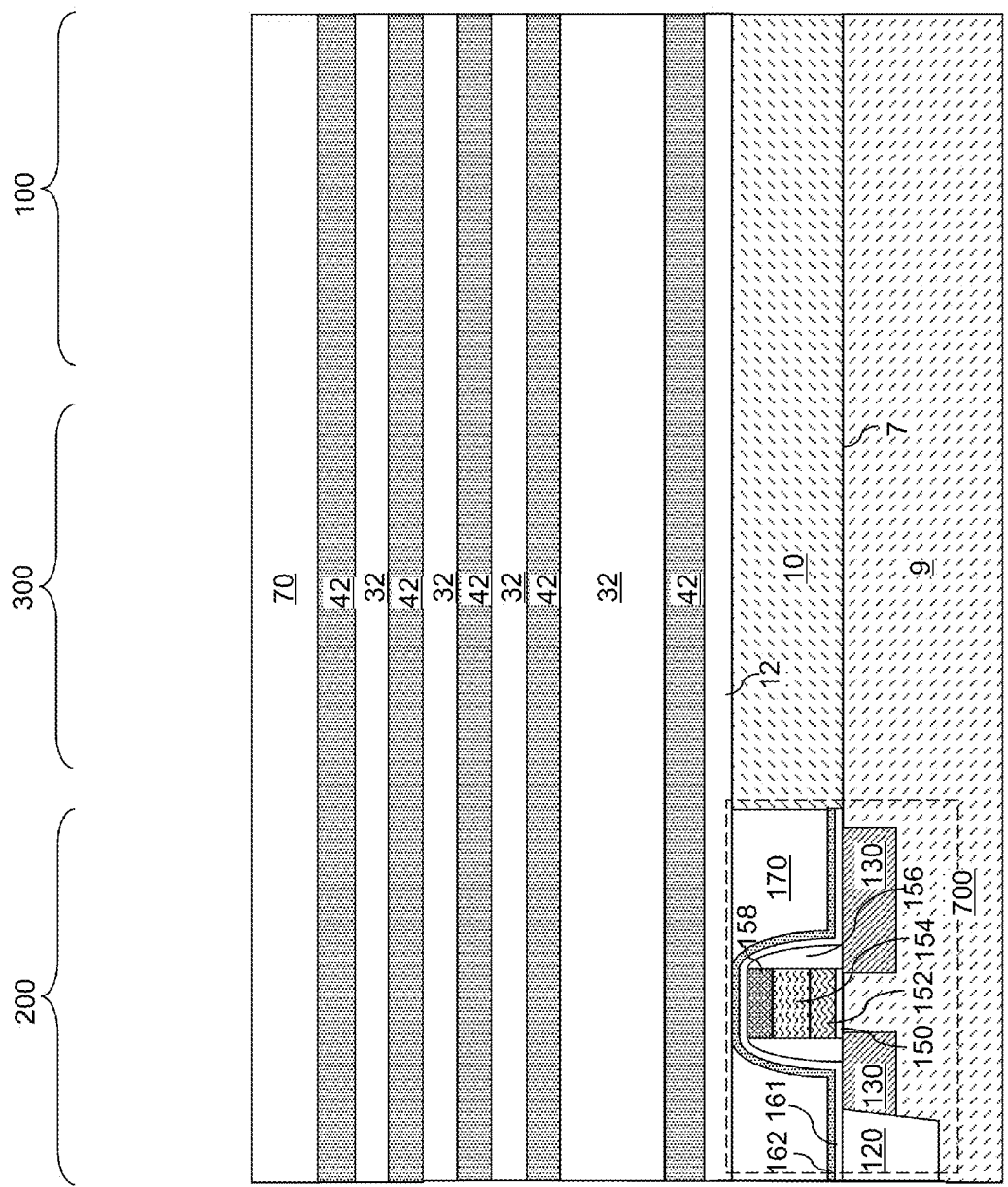
FIG. 1 is a schematic vertical cross-sectional view of an exemplary structure after formation of a stack including an alternating plurality of material layers according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (e.g., a p-type well, not expressly shown) can be formed within the substrate semiconductor layer 9 and/or the semiconductor material layer 10 located over the substrate semiconductor layer 9.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the dielectric pad layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
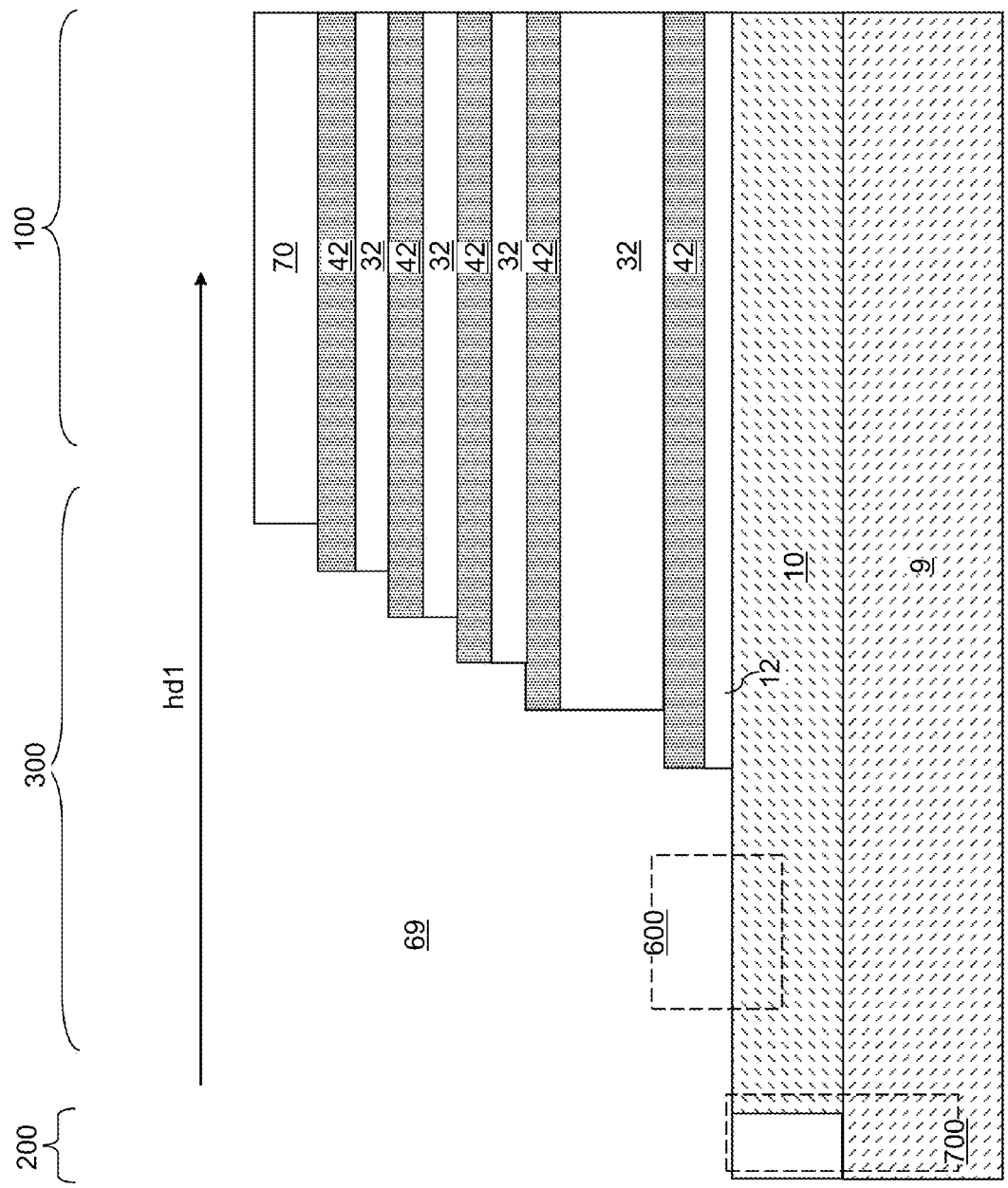
FIG. 2 is a schematic vertical cross-sectional view of the exemplary structure after formation of a terrace region on the stack according to an embodiment of the present disclosure.

Referring to FIG. 2, stepped terraces can be formed in the contact region 300. The stepped terraces can be formed by forming a stepped cavity within the contact region 300. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

Figure 3:
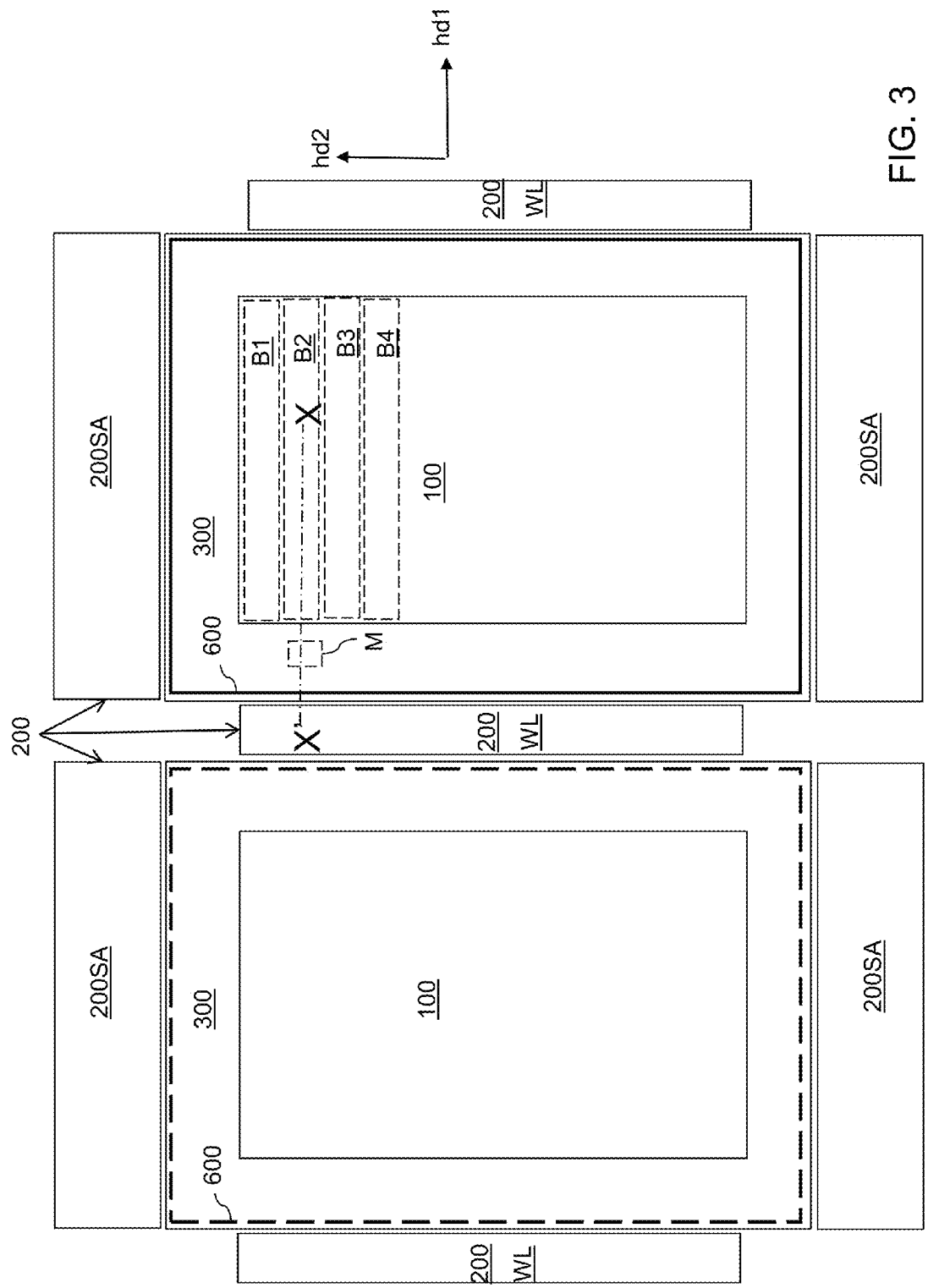
FIG. 3 is a plan view of an exemplary structure after formation of terrace regions according to an embodiment of the present disclosure.

FIG. 3 illustrates a layout of the exemplary structure in a plan view. The vertical cross-sectional plane X-X' corresponds the plane of the schematic vertical cross-sectional view of FIG. 2. Each memory array region 100 can be provided as a rectangular area including a plurality of blocks (B1, B2, B3, B4, etc.) that horizontally extend along a first horizontal direction hd1 that is parallel to one side of the rectangular area. Each memory region can have a pair of lengthwise edges that are parallel to the first horizontal direction hd1, and a pair of widthwise edges that are parallel to a second horizontal direction hd2 that is perpendicular to the first horizontal direction hd1. Each contact region can be provided as an hollow rectangular region (i.e., a region having an opening therethrough) having a rectangular outer periphery and a rectangular inner periphery. Other shapes may be used as well. Peripheral device regions 200 can be provided on the outside of the contact regions 300. Peripheral device regions may include word line peripheral regions 200WL containing word line and select gate switching transistors (i.e., row decoder/word line driver circuit devices) located on the "row" sides of regions 100 and bit line peripheral regions 200SA containing sense amplifier and/or other bit line peripheral devices (e.g., devices of the bit line driver circuit, such as charge pump circuit devices, reference voltage and current circuit, and/or power-on circuit, etc.) located on the "column" sides of regions 100.

According to an aspect of the present disclosure, a linear feature, such as a linear mark 600 can be provided within an outer portion of each contact region 300. The linear mark 600 can be provided along a portion of the outer periphery of each contact region 300 inside the area of the contact region 300. As used herein, a "mark" refers to a geometrical feature that can be detected by lithographic measurement tools such as critical dimension (CD) measurement tools or overlay measurement tools employed in the semiconductor industry. Commercially available lithographic measurement tools include Archer™ systems by KLA-Tencor® and Caliper™ by Nanometrics®. As used herein, a "linear mark" refers to a structure in which at least one line (e.g., a single line or at least two parallel lines) are present as a predominant geometrical feature. The structure embodying a linear mark can have a length-to-width ration greater than 5, and preferably greater than 10, and even more preferably greater than 20.

Each linear mark 600 of the present disclosure may be present as a continuous line segment that extends along a horizontal direction from one corner of a contact region 300 to another corner of the contact region 300, or may be present as a set of line segments that are laterally spaced from one another along the general propagation direction of the line segments. In one embodiment, a linear mark 600 can be provided in the vicinity of each outer periphery of the contact regions 300 that is parallel to the second horizontal direction or linear mark 600 may extend around the entire periphery of regions 300 as four line segments connected at 90 degree angles to each other.

Figure 4:
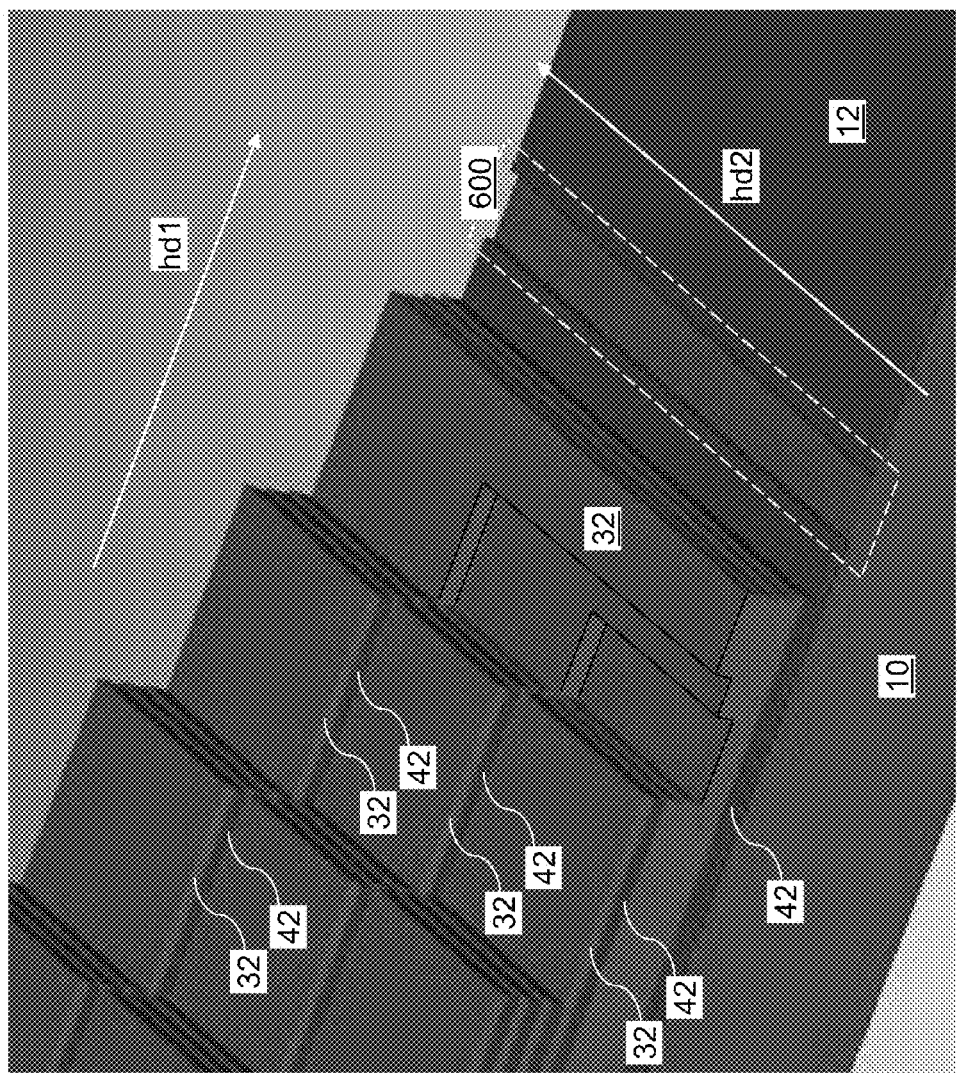
FIG. 4 is a perspective view of an exemplary terrace according to a first embodiment of the present disclosure.

The steps, i.e., the height differences, in the stepped terraces can be primarily along the direction between a most proximal inner edge and a most proximal outer edge of the contact region 300 for each area within the contact region 300. This direction is herein referred to as a primary step direction, i.e., a direction along which height changes occur primarily. For example, in the magnification region M, the primary step direction can be the first horizontal direction hd1, which is parallel to the lengthwise direction of the blocks (B1, B2, B3, B4, etc.). In one embodiment, the steps can be present only along the primary step direction, and not present along a horizontal direction that is perpendicular to the primary step direction. In another embodiment, additional steps can be provided along a direction that is perpendicular to the primary direction of steps, which is herein referred to as secondary step direction. The perspective view in FIG. 4 illustrates a configuration in which steps in the magnification region M are present in the primary step direction (that is parallel to the first horizontal direction hd1) and in the secondary step direction (that is parallel to the second horizontal direction hd2) to permit additional word line contacts to be formed in region 300 in any given plane which extends in the second horizontal direction hd2 for each block. In the configuration illustrated in FIG. 4, the linear mark 600 is embodied as a linear trench containing a pair of lines that can be defined in a plan view (i.e., a top-down view) from a pair of sidewalls of the trench in the dielectric pad layer 12 that are parallel to the second horizontal direction hd2. Alternatively, if the linear mark comprises a trench which extends into layer 10, then the lines may comprise sidewalls of the trench in layer 10. As will be described below, the terms "parallel", "line" and "linear" include substantially parallel and substantially linear directions which include unavoidable non-linearities (e.g., waviness and/or curvature), defects and/or deviations which are inherent in a photolithography and etching process.

Figure 5A:
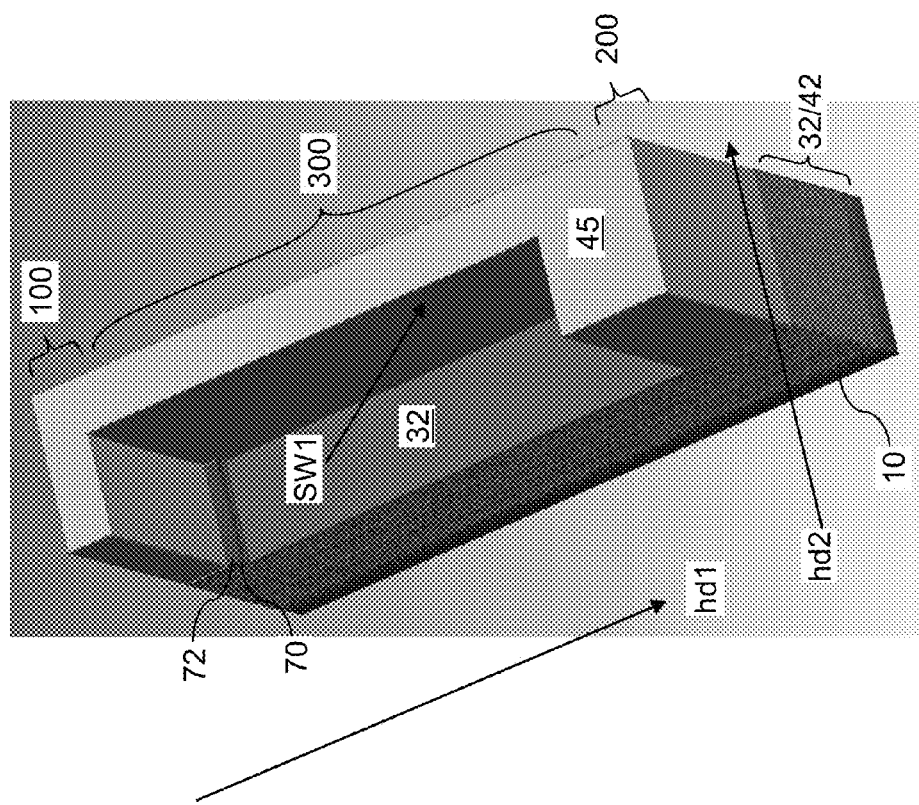
FIGS. 5A-5D are sequential perspective views of a terrace region during formation of a linear mark according to a first embodiment of the present disclosure.

FIGS. 5A-5D are sequential perspective views of a terrace region (i.e., a region of the stepped terraces) in region 300 during formation of a linear mark 600 according to a first embodiment of the present disclosure. Referring to FIG. 5A, a terrace region of the first exemplary structure of FIG. 1 is illustrated. The width of the illustrated region along the second horizontal direction corresponds to the width of a block in the memory array region 100. A sacrificial pad layer 72 may be optionally formed over the insulating cap layer 70. The sacrificial pad layer 72 includes a sacrificial material that can be subsequently removed selective to the insulating cap layer 70. For example, if the insulating cap layer 70 includes silicon oxide, the sacrificial pad layer 72 can include silicon nitride. The thickness of the sacrificial pad layer 72 can be in a range from 20 nm to 200 nm, although lesser and greater thicknesses can also be employed.

The sacrificial pad layer 72 can be patterned such that the sacrificial pad layer 72 covers the memory array region 100, and does not cover the contact region 300 or the peripheral device region 200. An optional first photoresist layer 45 can be applied over the alternating stack (32, 42) and lithographically patterned to form a first sidewall SW1 that is parallel to the lengthwise direction of the blocks (B1, B2, B3, B4, etc.) in the memory array region 100 (such as the first horizontal direction hd1). The pattern of the first photoresist layer 45 can be transferred through at least one pair of a sacrificial material layer 42 and an insulating layer 32. For example, the pattern of the first photoresist layer 45 can be transferred through the sacrificial pad layer 72, the insulating cap layer 70, a topmost sacrificial material layer 42, and a topmost insulating layer 32 by an anisotropic etch to form additional steps extending in the second horizontal direction (hd2).

Figure 5B:
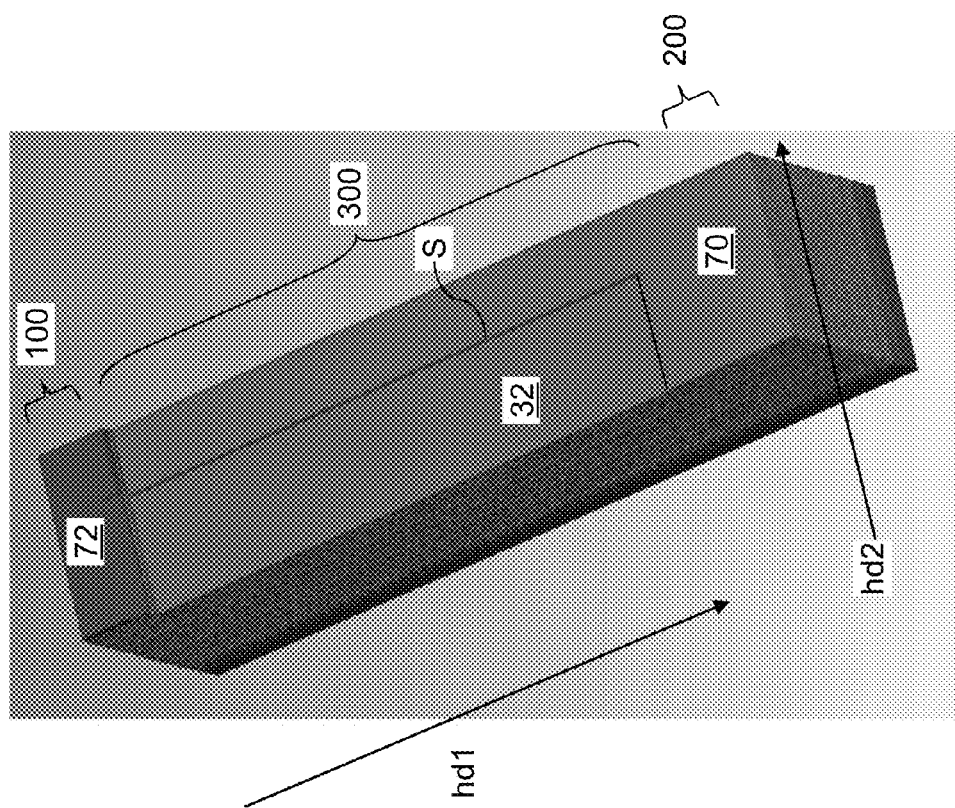

Referring to FIG. 5B, the first photoresist layer 45 can be removed, for example, by ashing. An optional step S, such as an L-shaped step or another shaped step can be formed between the top surface of the insulating cap layer 70 and the physically exposed top surface of the topmost insulating layer 32. The lengthwise edge of the L-shaped step that is parallel to the first horizontal direction hd1 can extend from a boundary between the memory array region 100 and the bottommost step of the stepped terraces to be formed. The shorter edge of the L-shaped step can extend along the second horizontal direction hd2 from an end of the lengthwise edge to a boundary to a neighboring block.

Figure 5C:
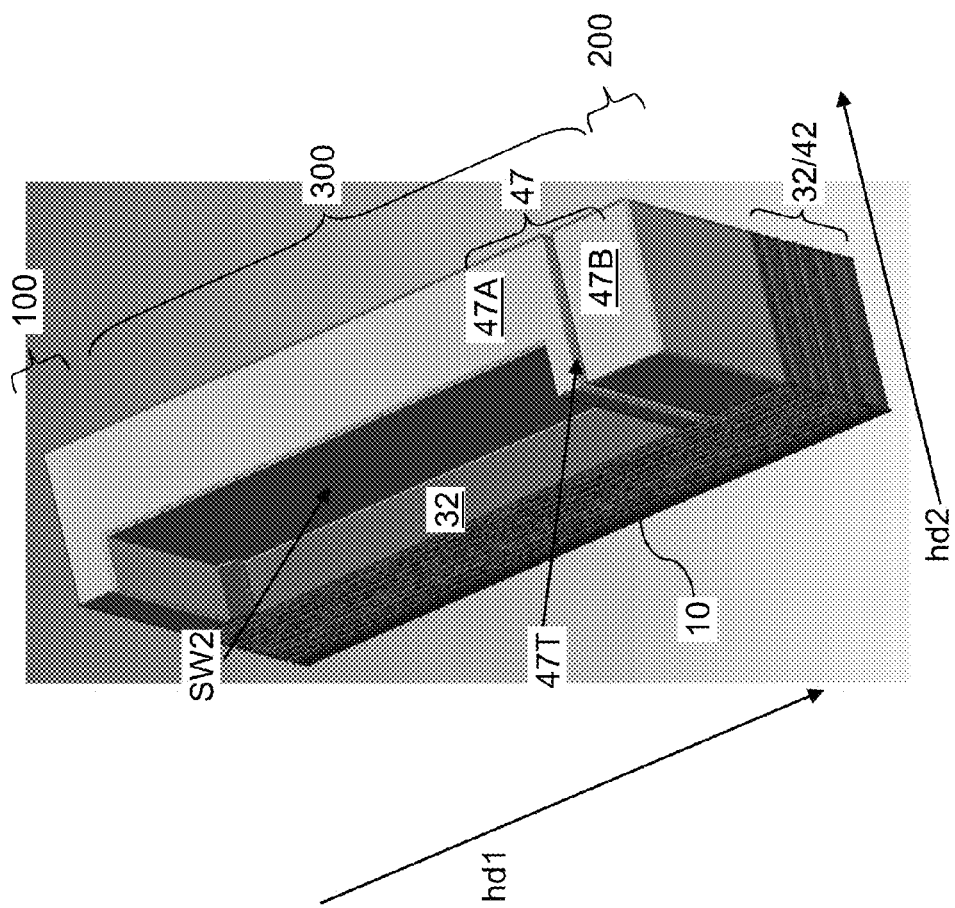

Referring to FIG. 5C, a second photoresist layer 47 is applied over the alternating stack (32, 42) and lithographically patterned to form a second sidewall SW2 that is parallel to the lengthwise direction of the blocks (B1, B2, B3, B4, etc.) in the memory array region 100 (such as the first horizontal direction hd1). The second sidewall SW2 is laterally offset from the lengthwise edge of the L-shaped step S illustrated in FIG. 5B along the second horizontal direction hd2. The pattern of the second photoresist layer 47 can be transferred through at least one pair of a sacrificial material layer 42 and an insulating layer 32. For example, the pattern of the second photoresist layer 47 can be transferred through a second-from-the-top sacrificial material layer 42 and a second-from-the-top insulating layer 32 by an anisotropic etch to form additional steps extending in the second horizontal direction (hd2).

One of the first photoresist layer 45 and the second photoresist layer 47 can be formed with a trench 47T that extends along the second horizontal direction (hd2) perpendicular to the lengthwise direction (i.e., the first horizontal direction (hd1)) of the blocks in the memory array region 100. For example, the second photoresist layer 47 can include a first photoresist portion 47A that includes a sidewall that is parallel to the first horizontal direction and another sidewall that is parallel to the second horizontal direction hd2 at a distal end of the contact region 300. As used herein, a proximal end of the contact region 300 refers to an end that adjoins a memory array region 100, and a distal end of the contact region 300 refers to an end that is located adjacent to the peripheral region 200 and at an opposite side of the proximal end. The second photoresist layer 47 can further include a second photoresist portion 47B that is parallel to the second horizontal direction hd2 and is more distal from the memory array region 100 than the first photoresist portion 47A. The pattern of the trench in the second photoresist layer 47 can be transferred to a pair of underlying layers such as the pair of the insulating cap layer 70 and the topmost sacrificial material layer 42. Alternatively, the second photoresist portion (i.e., the trench shaped opening) 47B used to form the linear mark 600 (i.e., the trench mark) may be located in a third photoresist layer which is deposited after the second photoresist layer 47 is removed. Alternatively, the steps which extend in the second horizontal direction (hd2) and respective photoresist layers 45 and 47 may be omitted, and, the second photoresist portion (i.e., the trench shaped opening) 47B used to form the linear mark 600 (i.e., the trench mark) may be located in a first photoresist layer that is dedicated to be used as a mask for etching the linear mark 600 in the alternating stack (32, 42).

Figure 5D:
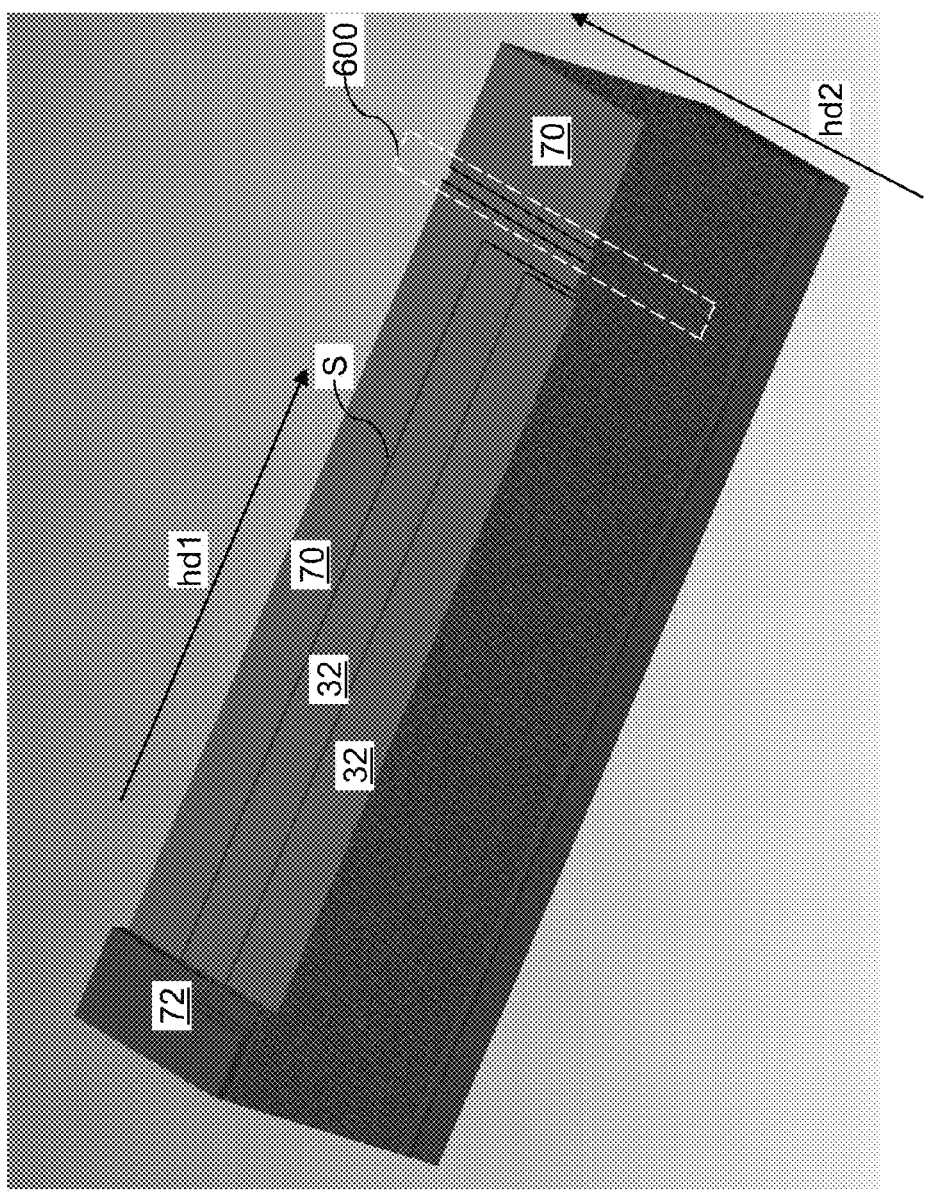

Referring to FIG. 5D, the first photoresist layer 45 can be removed, for example, by ashing. Another L-shaped step S can be formed between the top surface of the topmost insulating layer 32 and the physically exposed top surface of a second-from-the-top insulating layer 32. The lengthwise edge of the newly formed L-shaped step that is parallel to the first horizontal direction hd1 can extend from a boundary between the memory array region 100 and the bottommost step of the stepped terraces to be formed. The shorter edge of the L-shaped step can extend along the second horizontal direction hd2 from an end of the lengthwise edge to a boundary to a neighboring block.

The linear mark 600 is formed through a set of layers located at an upper portion of the alternating stack (32, 42). The linear mark 600 laterally extends perpendicular to the first horizontal direction hd1 and parallel to the second horizontal direction hd2. In one embodiment, the linear mark 600 can include a trench pattern that laterally extends along the second horizontal direction hd2 and vertically extends through at least one layer within the alternating stack (32, 42). A vertical step (the lengthwise portion of the L-shaped step) providing a height difference corresponding to a pair of an insulating layer 32 and a spacer material layer (such as a sacrificial material layer 42) in the alternating stack (32, 42) can be formed concurrently with formation of the linear mark 600. In one embodiment, the vertical step can extend along the first horizontal direction hd1. While the present disclosure is described employing an embodiment in which vertical steps are formed between top surfaces of insulating layers 32, embodiments are expressly contemplated herein in which vertical steps are formed between top surfaces of sacrificial material layers 42.

FIGS. 6A-6E illustrate sequential schematic vertical cross-sectional views of the terrace region during formation of the exemplary terrace illustrated in FIG. 4 employing the exemplary structure having the features illustrated in FIG. 5D. According to an aspect of the present disclosure, a set of staircase-forming processing steps can be performed at least twice. Each set of staircase-forming processing steps includes a first step of forming a trimming material layer having a sidewall that is laterally offset from the linear mark 600 by a respective substantially uniform lateral offset distance, and a second step of repeatedly performing a combination of an etch process and a trimming process. Each etch process transfers a pattern of the trimming material layer vertically through a set of layers within the alternating stack to form stepped surfaces, and each trimming process isotropically trims the trimming material layer. Each set of staircase-forming processing steps can include a third step of removing a remaining portion of the trimming material layer.

Figure 6A:
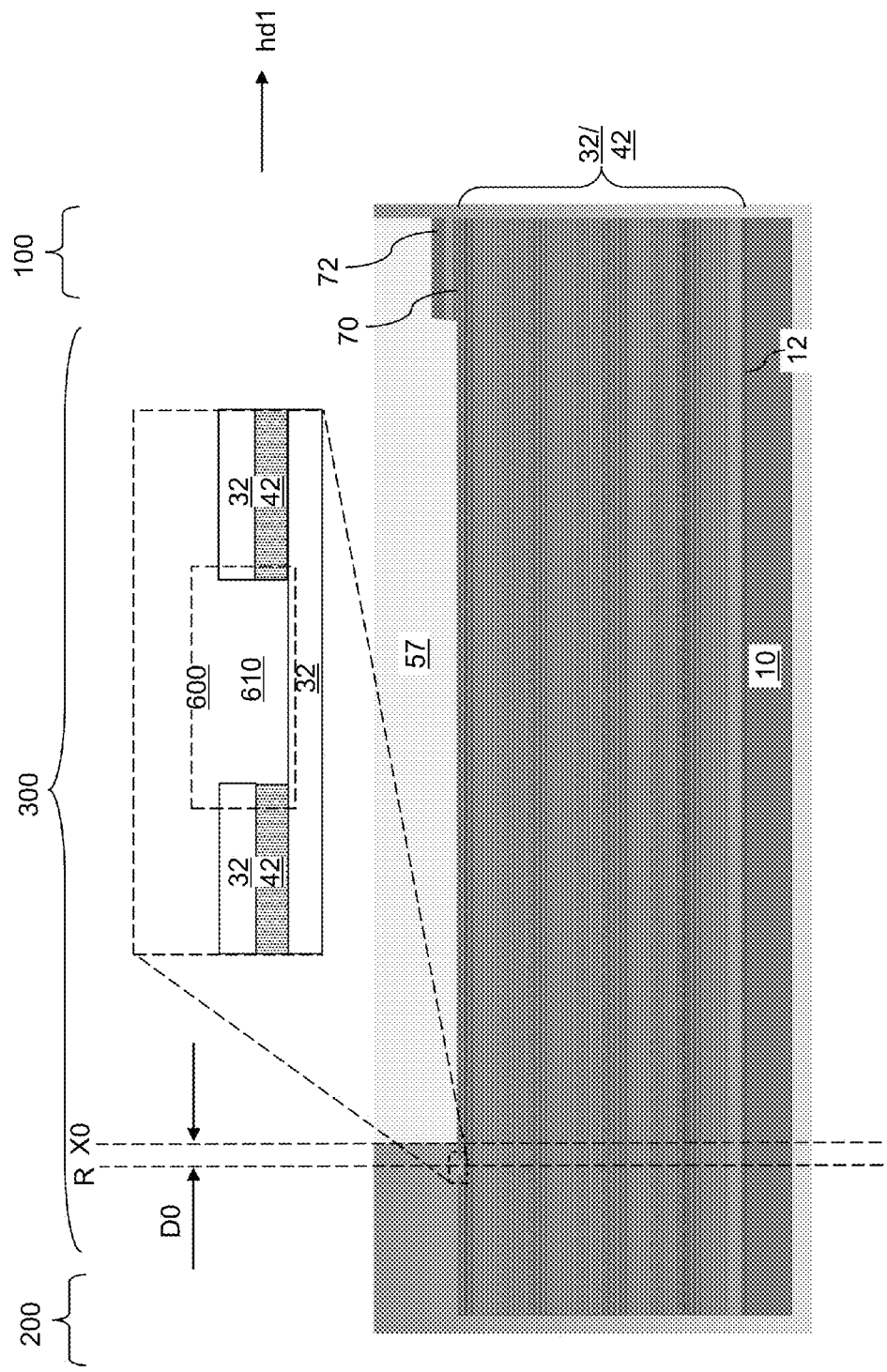
FIGS. 6A-6E are sequential schematic vertical cross-sectional views of the terrace region during formation of the exemplary terrace illustrated in FIG. 4 according to the first embodiment of the present disclosure.

Referring to FIG. 6A, a first step within a first set of staircase-forming processing steps can be performed. Specifically, a first trimming material layer 57 is applied over the exemplary structure, and is subsequently lithographically patterned to form a sidewall that is parallel to the second horizontal direction hd2. The first trimming material layer 57 comprises a material that can be continually trimmed, i.e., a material that can be gradually removed over time duration from outside to inside at a controlled removal rate. For example, the first trimming material layer 57 can be selected from a photoresist material, an organic polymer material, and an inorganic polymer material. Organic polymer materials that can be employed for the first trimming material layer 57 can be an organic material made of cross-linked carbon-containing monomers, and can be carbon-based self-planarizing material known in the art. Inorganic polymer material that can be employed for the first trimming material layer 57 include silicon-based polymer materials such as silicon-based antireflective coating materials as known in the art.

The patterned first trimming material layer 57 covers the memory array region 100 and a proximal portion of each contact region 300, and does not cover the linear mark 600. The linear mark 600 can include a linear trench 610 defined by a pair of sidewalls of a stack of an insulating layer 32 and a sacrificial material layer 42 that extends along the second horizontal direction hd2. In one embodiment, a vertical plane (which is seen as a line in a top-down view) that passes through the geometrical center of the linear trench 610 and extending along the second horizontal direction hd2 can define a reference feature R from which an initial lateral offset D0 of a distal sidewall of the first trimming material layer 57 can be measured along the first horizontal direction hd1. The distal sidewall of the first trimming material layer 57 defines a vertical sidewall that defines the initial location X0 of the distal sidewall of the first trimming material layer 57 with respect to the reference feature R.

Figure 6B:
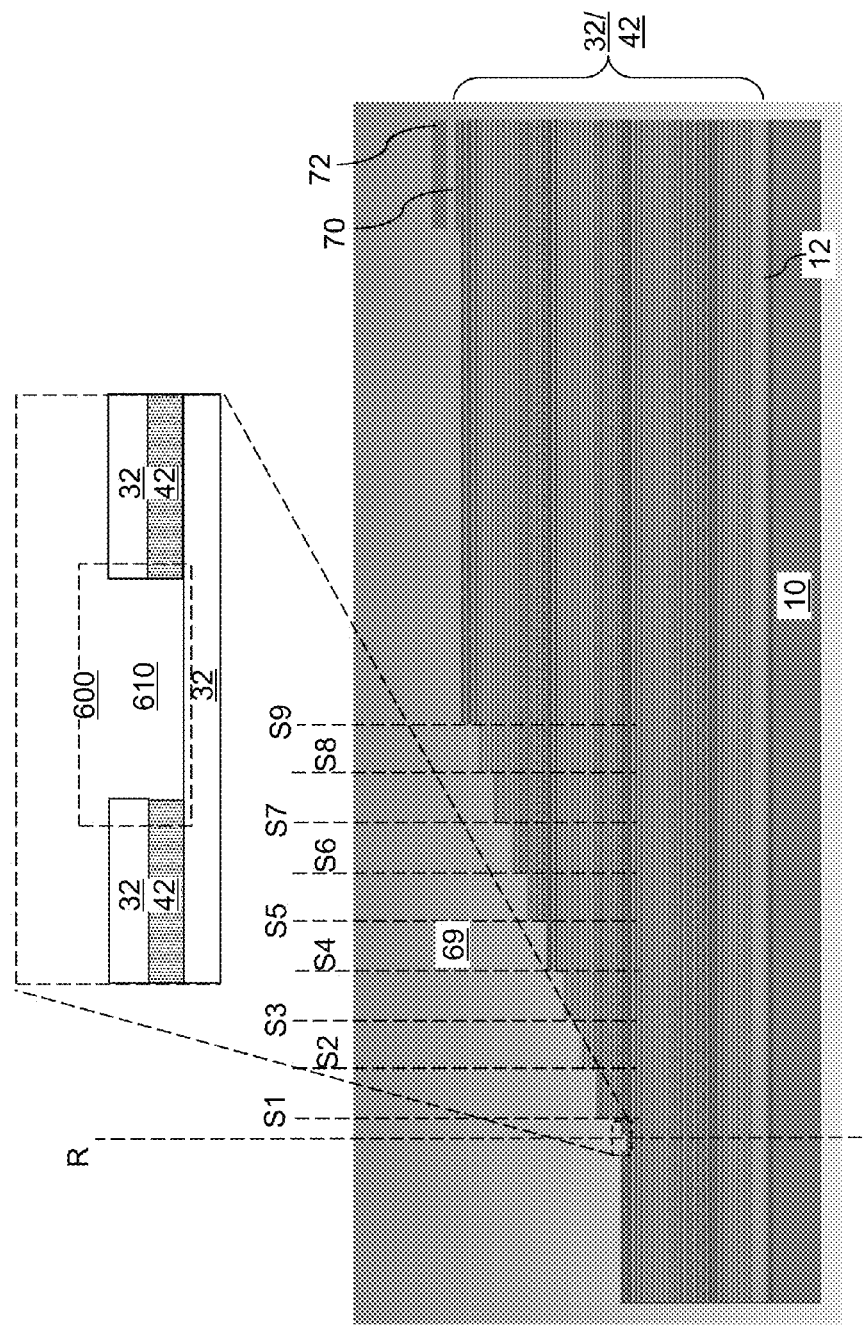

Referring to FIG. 6B, a second step within the first set of staircase-forming processing steps can be performed. The second step includes repetitions of a combination of an etch process and a trimming process. Each etch process transfers a pattern of the first trimming material layer 57 vertically through a set of layers within the alternating stack (32, 42) to form stepped surfaces. For example, each etch process can be an anisotropic etch process that transfers preexisting patterns in the alternating stack (32, 42) through a predetermined number of pairs of an insulating layer 32 and a sacrificial material layer 42. The predetermined number can be the same as the total number of steps that are present along the second horizontal direction prior to performing the first step within the first set of staircase-forming processing steps. For example, the predetermined number can be 3 in the case of the configuration illustrated in FIG. 5D.

Each trimming process isotropically trims the first trimming material layer 57. The trimming distance during each trimming process can be the same as the lateral dimension of each step along the first horizontal direction. By repeatedly performing the combination of the etch process and the trimming process, multiple steps are generated along the first horizontal direction hd1 within the contact region 300, thereby forming a stepped cavity 69.

In one embodiment, each etch process transfers a pattern of the patterned first trimming material layer 57 vertically through one or more pairs of an insulating layer 32 and a sacrificial material layer 42. In case vertical steps along the second horizontal direction hd2 are formed during the processing steps of FIGS. 5A-5D, each etch process can transfer a respective pattern of the first trimming material layer 57 vertically through at least two insulating layers 32 and at least two spacer material layers 42 within the alternating stack (32, 42). Concurrently with transfer of the existing pattern outside the area covered by the first trimming material layer 57, a new pattern of vertical steps coinciding with the location of the trimmed sidewall of the first trimming material layer 57 is transferred through the upper portion of the alternating stack (32, 42). In addition, the linear mark 600 is transferred downward during each etch process within the first set of staircase-forming processing steps.

The locations of the vertical steps (S1-S9) can be measured during the second step. For example, the location of the distal sidewall of the first trimming material layer 57 can be measured after one or more of the trimming processes in the second step to determine whether locations of the vertical steps (S1-S9) are within a predetermined specification range. If a lateral offset distance between a vertical step (S1-S9) and the reference feature R is less than a predetermined target after a trimming process, a touch-up trimming process can be employed to increase the lateral offset distance toward the predetermined target. If a lateral offset distance between a vertical step (S1-S9) and the reference feature R is greater than a predetermined target, the first trimming material layer 57 can be removed, and a replacement trimming material layer (not shown) can be applied and patterned to provide a distal sidewall located at, or near, the target lateral offset distance. Similarly, measurement of the lateral offset distance between the vertical steps (S1-S9) and the reference feature R can also be employed to control the amount of trimming on the first trimming material layer 57 during the next trimming process.

The linear mark 600 facilitates measurement at multiple locations to generate a statistical distribution of measured values of the lateral offset distance. Unlike prior art measurement schemes in which an overlay of a patterned features is measured relative to a point-like reference feature (such as a crosshair or a box-in-a-box mark) that are sparsely scattered throughout a lithographic mask, the linear mark 600 of the present disclosure extends along the second horizontal direction hd2 from one end of the contact region 300 to the other end of the contact region 300. Measurement of the lateral offset distance may be made only along the first horizontal direction hd1 between each selected region of the distal sidewall of the as trimmed first trimming material layer 57 and the portion of the linear mark 600 that is intersected by a vertical plane R. Thus, the measurement of the lateral offset distance between the vertical steps (S1-S9) or the distal sidewall of the first trimming material layer 57 with respect to the linear mark 600 may include measurement of distance only along one direction, i.e., along the first horizontal direction hd1.

After performing the last combination of the etch process and the trimming process within the second step, a third step of removing a remaining portion of the first trimming material layer 57 is performed to provide the structure of FIG. 6B.

Figure 6C:
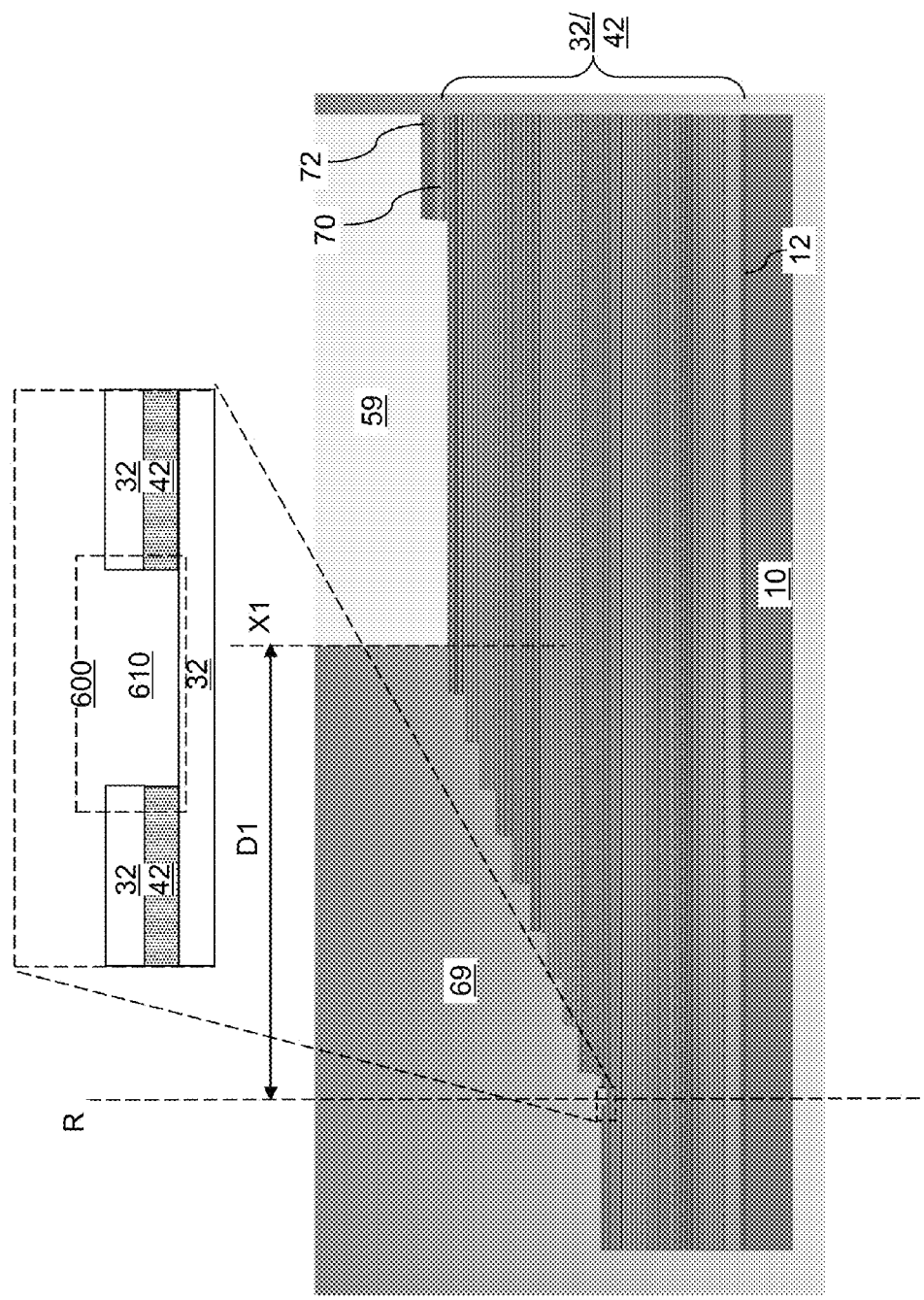

Referring to FIG. 6C, a second set of staircase-forming processing steps can be performed after the first set of staircase-forming processing steps is completed. The second set of staircase-forming processing steps can be identical to the first set of staircase-forming processing steps with the modification of the pattern for the second trimming material layer 59 with respect to the staircase pattern formed using the first trimming material layer 57. Specifically, a second trimming material layer 59 is applied over the exemplary structure, and is subsequently lithographically patterned to form a sidewall that is parallel to the second horizontal direction hd2. The second trimming material layer 59 comprises a material that can be continually trimmed. The second trimming material layer 59 can include any of the material that can be employed for the first trimming material layer 57.

The patterned second trimming material layer 59 covers the memory array region 100 and a proximal portion of each contact region 300, and does not cover the linear mark 600 or the patterned portion of the contact region 300 including the vertical steps (S1-S9). The distal sidewall of the second trimming material layer 59 defines a vertical sidewall that defines the initial location X1 of the distal sidewall of the second trimming material layer 59 with respect to the reference feature R (i.e., feature R and location X1 are separated by distance D1).

Figure 6D:
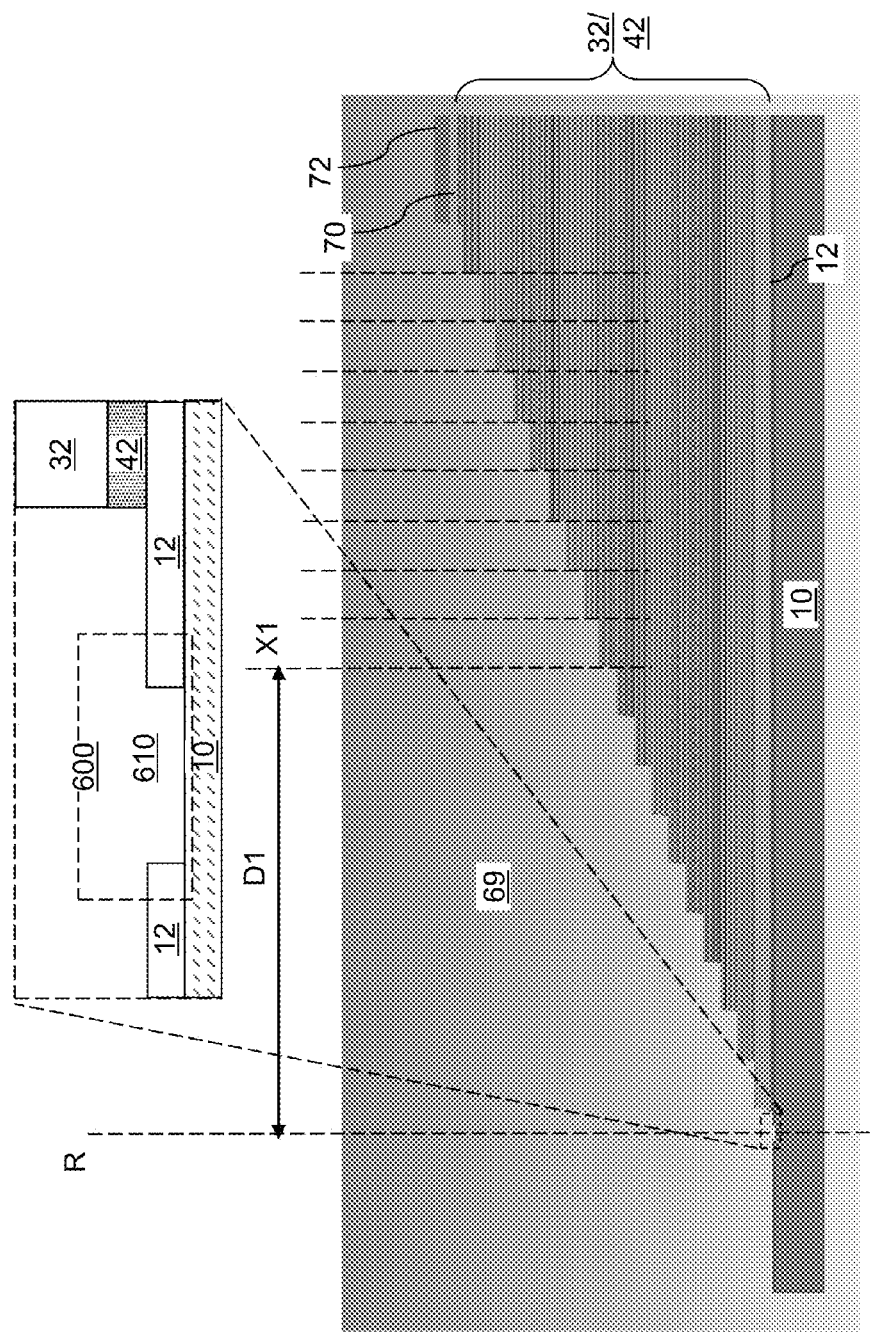

Referring to FIG. 6D, a second step within the second set of staircase-forming processing steps can be performed. The second step includes repetitions of a combination of an etch process and a trimming process. The processing parameters of each etch process in the second set of staircase-forming processing steps can be the same as the processing parameters of the etch processes in the first set of staircase-forming processing steps. If the same material is employed for the first and second trimming material layers (57, 59), the processing parameters of the trimming steps in the second set of staircase-forming processing steps can be the same as the processing parameters of the trimming steps in the first set of staircase-forming processing steps.

Each etch process transfers a pattern of the second trimming material layer 59 vertically through a set of layers within the alternating stack (32, 42) to form stepped surfaces. For example, each etch process can be an anisotropic etch process that transfers preexisting patterns in the alternating stack (32, 42) through a predetermined number of pairs of an insulating layer 32 and a sacrificial material layer 42. The predetermined number can be the same as the total number of steps that are present along the second horizontal direction prior to performing the first step within the second set of staircase-forming processing steps. For example, the predetermined number can be 3 in the case of the configuration illustrated in FIG. 5D.

Each trimming process isotropically trims the second trimming material layer 59. The trimming distance during each trimming process can be the same as the lateral dimension of each step along the first horizontal direction. By repeatedly performing the combination of the etch process and the trimming process, additional steps are generated along the first horizontal direction hd1 within the contact region 300, and the stepped cavity 69 is laterally and vertically expanded.

In one embodiment, each etch process transfers a pattern of the patterned second trimming material layer 59 vertically through one or more pairs of an insulating layer 32 and a sacrificial material layer 42. In case vertical steps along the second horizontal direction hd2 are formed during the processing steps of FIGS. 5A-5D, each etch process can transfer a respective pattern of the second trimming material layer 59 vertically through at least two insulating layers 32 and at least two spacer material layers 42 within the alternating stack (32, 42). Concurrently with transfer of the existing pattern outside the area covered by the second trimming material layer 59, a new pattern of vertical steps coinciding with the location of the trimmed sidewall of the second trimming material layer 59 is transferred through the upper portion of the alternating stack (32, 42). In addition, the linear mark 600 is transferred downward during each etch process within the second set of staircase-forming processing steps.

After performing the last combination of the etch process and the trimming process within the second step, a third step of removing a remaining portion of the second trimming material layer 59 is performed to provide the structure of FIG. 6D.

Figure 6E:
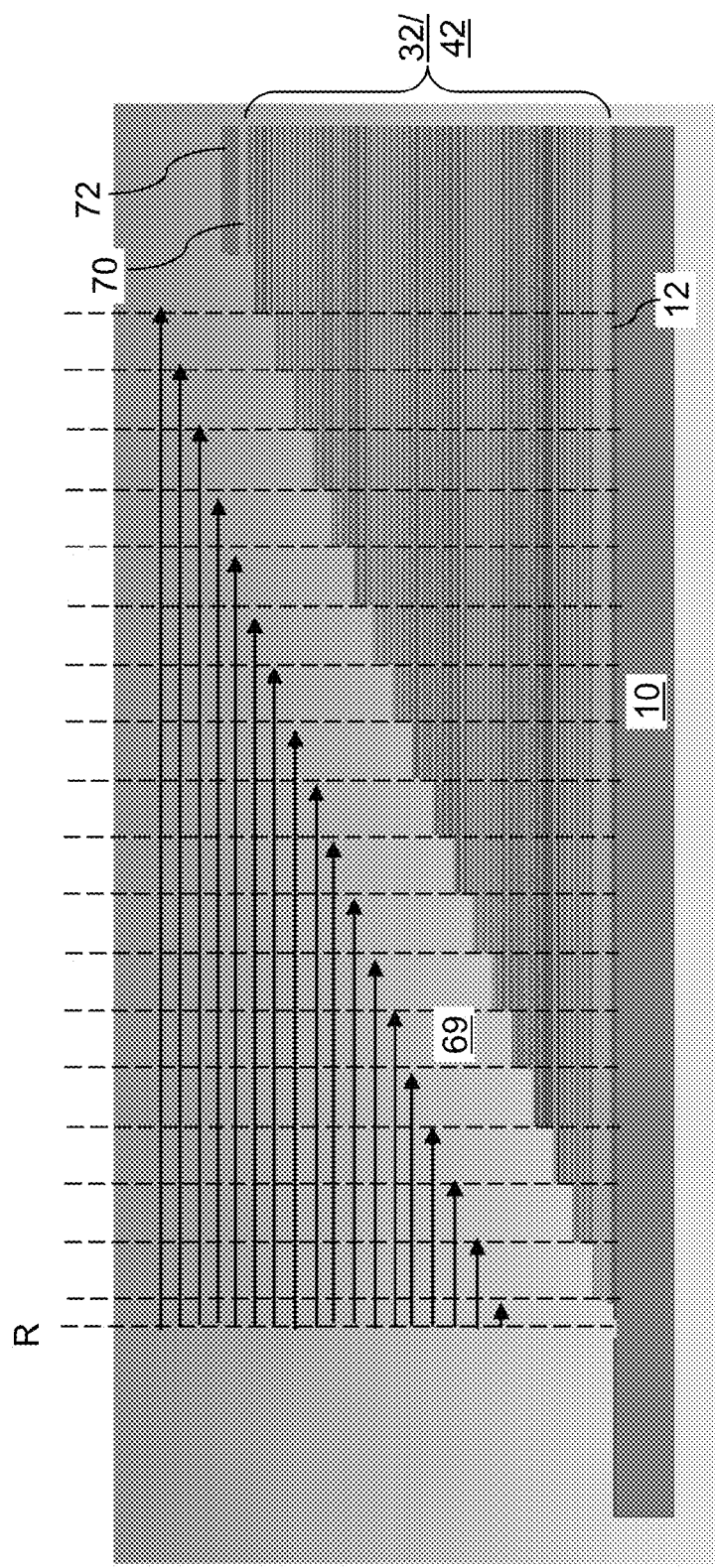

The locations of the additional vertical steps can be measured during the second step. FIG. 6E illustrates various measurements between a vertical step and the reference feature R. In addition, the locations of the sidewall of the trimming material layers (57, 59) can be formed from the reference feature during various stages of the trimming processes. For example, the location of the distal sidewall of the second trimming material layer 59 can be measured after one or more of the trimming processes in the second step to determine whether locations of the vertical steps are within a predetermined specification range. If a lateral offset distance between a vertical step and the reference feature R is less than a predetermined target after a trimming process, a touch-up trimming process can be employed to increase the lateral offset distance toward the predetermined target. If a lateral offset distance between a vertical step and the reference feature R is greater than a predetermined target, the second trimming material layer 59 can be removed, and a replacement trimming material layer (not show) can be applied and patterned to provide a distal sidewall located at, or near, the target lateral offset distance. Similarly, measurement of the lateral offset distance between the vertical steps and the reference feature R can also be employed to control the amount of trimming on the second trimming material layer 59 during the next trimming process. As discussed above, the linear mark 600 facilitates measurement at multiple locations to generate a statistical distribution of measured values of the lateral offset distance.

Additional set of staircase-forming processing steps can be performed until a terrace region including stepped surfaces is formed on the alternating stack (32, 42). The stepped surfaces can continuously extend from a bottommost layer within the alternating stack (32, 42) to a topmost layer within the alternating stack (32, 42) upon completion of the last set of staircase-forming processing steps. Each set of staircase-forming processing steps can have an identical set of processing steps as the first or second set of staircase-forming processing steps with appropriate modifications to the pattern of respective trimming material layers and/or other appropriate changes. In one embodiment, the linear mark 600 can include a linear trench 610 pattern that laterally extends along the second horizontal direction hd2 and vertically extends through a dielectric pad layer 12 underlying the alternating stack (32, 42).

In one embodiment, the stepped surfaces in the terrace region can include top surfaces of each insulating layer 32 within the alternating stack (32, 42). In another embodiment, the stepped surfaces in the terrace region can include top surfaces of each sacrificial material layer 42 within the alternating stack (32, 42).

In one embodiment, a sidewall of the linear mark 600 is laterally spaced from a sidewall of a bottommost electrically conductive layer 46 to be subsequently formed within the alternating stack by a lateral distance that is in a range from 10% of an average lateral spacing between neighboring vertical steps of the terrace region and 300% of the average lateral spacing between neighboring vertical steps of the terrace region.

In one embodiment, lateral offset distances between a subset of vertical surfaces within the stepped surfaces can be measured while, and/or after the terrace region is formed. For example, each set of staircase-forming processing steps can optionally include a measurement step for measuring at least one physical lateral offset distance between the sidewall of the trimming material layer (57, 59) in the contact region 300 and the linear mark 600 along the first horizontal direction hd1 after, or before, a trimming step. Because the linear mark 600 functions as a reference point that extends along the second horizontal direction hd2, the measured distance can include of a distance along the first horizontal direction hd1, and does not include any distance component along the second horizontal direction hd2. In this case, the at least one physical offset distance can include a plurality of physical offset distances that are measured at different locations of the sidewalls of the trimming material layer or vertical steps of the stepped terraces. The different locations can be spaced apart along the second horizontal direction hd2. Measurement at multiple locations can provide a more accurate indicator of the distribution of the lateral offset distances because the sidewall of the trimming material layer or the vertical steps of the stepped terraces can have random variations (e.g., non-linearities) caused by local non-uniformity of the trimming processes or foreign particles introduced during any of the processing steps. However, since the linear mark 600 (e.g., linear trench) and trimming material layer (57, 59) edges or step edges are formed during the same photolithography and/or etching steps, they should include the same random variations (e.g., non-linearities) and have the same contour (i.e., the same deviation from a perfectly straight line shape). The step edges and the linear mark 600 are parallel to each other along the second horizontal direction hd2 even if both contain the same non-linearities. In one embodiment, the at least one physical offset distance can measured between a line "R" that passes through the geometrical center of the linear mark 600 and extends along the second horizontal direction hd2. Thus, the at least one physical offset distance along the first horizontal direction hd1 from the center of the linear mark 600 to a corresponding point on step edge or trimming material layer (57, 59) edge will be the same at any point along a line which extends in the second horizontal direction hd2. Therefore, the linear mark 600 is advantageous over a point alignment mark for forming the staircases because the point alignment mark does not take into account the non-linearities in the edges of the steps in the stairs and/or edges of the trimming material layer.

While the present disclosure is described employing an embodiment in which two or more sets of staircase-forming processing steps, embodiments are expressly contemplated herein in which only a single set of staircase-forming processing steps is employed. Further, embodiments are expressly contemplated herein in which the vertical steps in the stepped terraces are transferred through only one pair of an insulating layer 32 and a sacrificial material layer 42.

Referring to FIGS. 7A-7D, an alternative processing sequence that can be employed in lieu of the processing steps of FIGS. 5A-5D is illustrated according to a second embodiment of the present disclosure. The alternative processing sequence can be employed to form a linear mark 600 that is in a form of a raised rail (e.g., ridge) 620 rather than a trench 610. The linear mark 600 may be formed in an upper portion of the alternating stack (32, 42) prior to performing any set of staircase-forming processing steps.

Figure 7A:
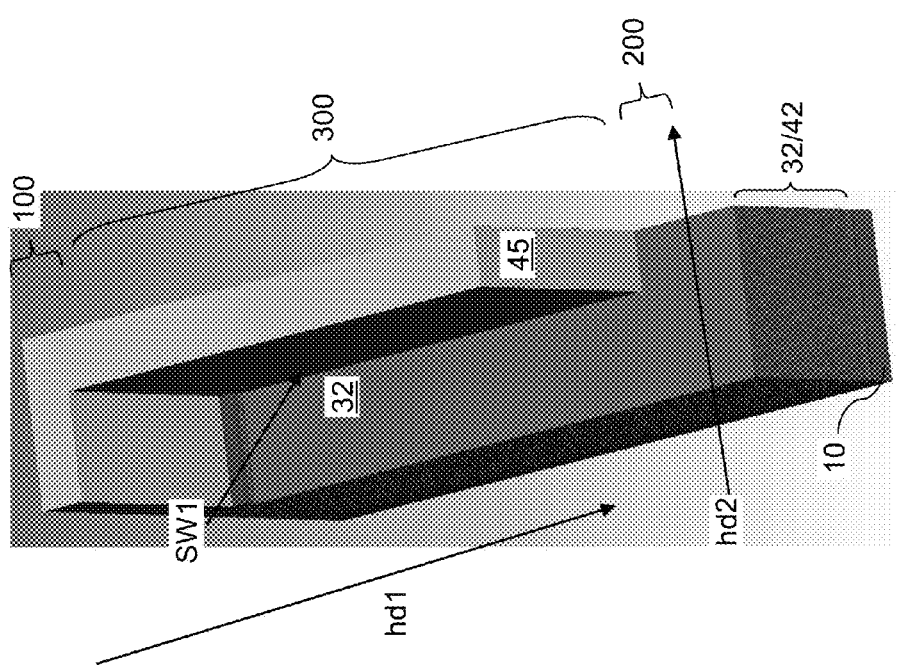
FIGS. 7A-7D are sequential perspective views of a terrace region during formation of a linear mark according to a second embodiment of the present disclosure.

Referring to FIG. 7A, a terrace region of the first exemplary structure of FIG. 1 is illustrated. The width of the illustrated region along the second horizontal direction corresponds to the width of a block in the memory array region 100. A sacrificial pad layer 72 may be optionally formed over the insulating cap layer 70. The sacrificial pad layer 72 includes a sacrificial material that can be subsequently removed selective to the insulating cap layer 70. For example, if the insulating cap layer 70 includes silicon oxide, the sacrificial pad layer 72 can include silicon nitride. The thickness of the sacrificial pad layer 72 can be in a range from 20 nm to 200 nm, although lesser and greater thicknesses can also be employed.

The sacrificial pad layer 72 can be patterned such that the sacrificial pad layer 72 covers the memory array region 100, and does not cover the contact region 300 or the peripheral device region 200. The structure of FIG. 7A can be the same as the structure of FIG. 5A. The shape of the photoresist layer 45 may be different in FIG. 7A than in FIG. 5A to form a linear instead of S-shaped step. Layers 70 and 72 are etched using the first photoresist layer 45 to form a first step S.

Figure 7B:
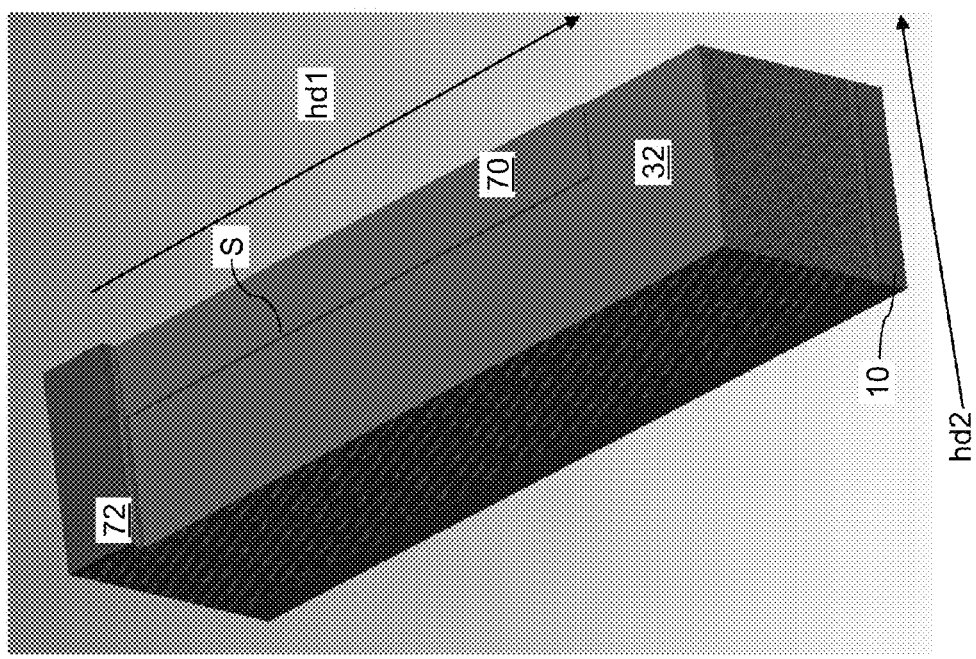

Referring to FIG. 7B, the first photoresist layer 45 can be removed, for example, by ashing. An optional step S can be formed between the top surface of the insulating cap layer 70 and the physically exposed top surface of the topmost insulating layer 32. The lengthwise edge of the step is parallel to the first horizontal direction hd1 and can extend from a boundary between the memory array region 100 and the bottommost step of the stepped terraces to be formed adjacent to the peripheral region 200.

Figure 7C:
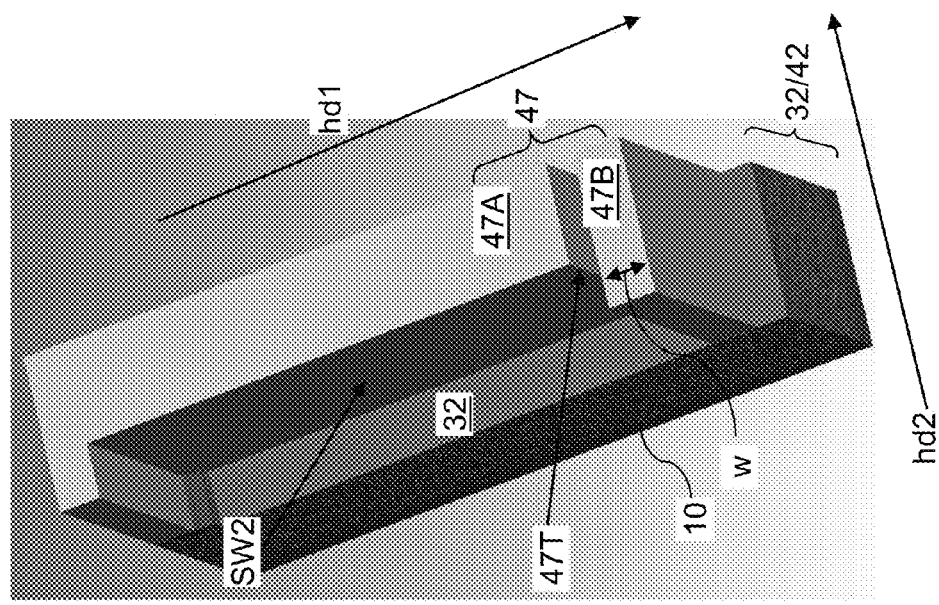

Referring to FIG. 7C, a second photoresist layer 47 is applied over the alternating stack (32, 42) and lithographically patterned to form a second sidewall SW2 that is parallel to the lengthwise direction of the blocks (B1, B2, B3, B4, etc.) in the memory array region 100 (such as the first horizontal direction hd1). The second sidewall SW2 is laterally offset from the lengthwise edge of the step S illustrated in FIG. 7B along the second horizontal direction hd2. The pattern of the second photoresist layer 47 can be transferred through at least one pair of a sacrificial material layer 42 and an insulating layer 32. For example, the pattern of the second photoresist layer 47 can be transferred through a second-from-the-top sacrificial material layer 42 and a second-from-the-top insulating layer 32 by an anisotropic etch to form a second optional step in the second horizontal direction hd2.

One of the first photoresist layer 45 and the second photoresist layer 47 can be formed with line pattern having a uniform width. The line pattern can extend along the second horizontal direction hd2 which is perpendicular to the lengthwise direction of the blocks in the memory array region 100. For example, the second photoresist layer 47 can include a first photoresist portion 47A that includes a sidewall (SW2) that is parallel to the first horizontal direction hd1. The second photoresist layer 47 can further include a second photoresist portion 47B that has a uniform width w along the first horizontal direction hd1 and extends along the second horizontal direction hd2 and is more distal from the memory array region 100 than the first photoresist portion 47A (i.e., closer to the peripheral region 200). In one embodiment, the width w of the second photoresist portion 47B can be between the minimum printable dimension for a line on the second photoresist layer 47 and ten times the minimum printable dimension for a line on the second photoresist layer 47. The pattern of the line structure as embodied in the second photoresist portion 47B of the second photoresist layer 47 can be transferred to a pair of underlying layers such as the pair of the insulating cap layer 70 and the topmost sacrificial material layer 42. For example, the width w of the second photoresist portion 47B can be in a range from 32 nm to 1,000 nm, although lesser and greater widths can also be employed. The raised second photoresist portion 47B is used to etch the alternating stack (32, 42) to form the raised rail shaped linear mark 620.

Figure 7D:
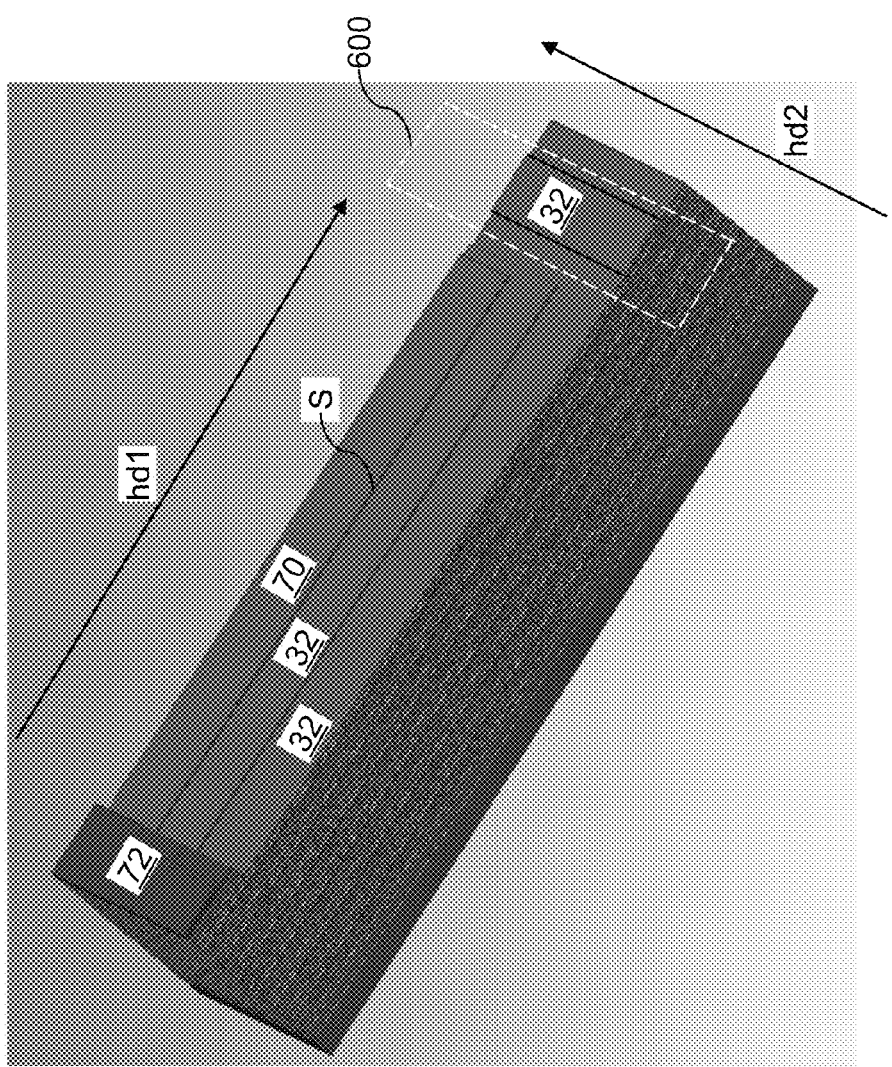

Referring to FIG. 7D, the first photoresist layer 45 can be removed, for example, by ashing. Another step S can be formed between the top surface of the topmost insulating layer 32 and the physically exposed top surface of a second-from-the-top insulating layer 32. The lengthwise edge of the newly formed step that is parallel to the first horizontal direction hd1 can extend from a boundary between the memory array region 100 and the bottommost step of the stepped terraces to be formed. The shorter edge of the step can extend along the second horizontal direction hd2 from an end of the lengthwise edge to a boundary to a neighboring block.

The linear mark 600 is formed through a set of layers located at an upper portion of the alternating stack (32, 42). The linear mark 600 laterally extends perpendicular to the first horizontal direction hd1 and parallel to the second horizontal direction hd2. The linear mark 600 can comprise a rail structure that laterally extends along the second horizontal direction hd2 and vertically protrudes upward (i.e., a raised rail, e.g., ridge). The rail structure is defined by a planar top surface and a pair of parallel vertical sidewalls adjoining the planar top surface. In one embodiment, the linear mark 600 can include a set of layers located at an upper portion of the alternating stack (32, 42) such as a topmost insulating layer 32 and a second-from-the-top sacrificial material layer 42. The linear mark 600 laterally extends perpendicular to a first horizontal direction hd1 and parallel to a second horizontal direction hd2. A vertical step (the lengthwise portion of the step) providing a height difference corresponding to a pair of an insulating layer 32 and a spacer material layer (such as a sacrificial material layer 42) in the alternating stack (32, 42) can be formed concurrently with formation of the linear mark 600. In one embodiment, the vertical step can extend along the first horizontal direction hd1. While the present disclosure is described employing an embodiment in which vertical steps are formed between top surfaces of insulating layers 32, embodiments are expressly contemplated herein in which vertical steps are formed between top surfaces of sacrificial material layers 42.

FIGS. 8A-8E illustrate sequential schematic vertical cross-sectional views of the terrace region of FIG. 6D during subsequent processing steps that forms the terrace illustrated in FIG. 9 and which will be described below. According to an aspect of the present disclosure, a set of staircase-forming processing steps can be performed at least twice. Each set of staircase-forming processing steps includes a first step of forming a trimming material layer having a sidewall that is laterally offset from the linear mark 600 by a respective substantially uniform lateral offset distance, and a second step of repeatedly performing a combination of an etch process and a trimming process. Each etch process transfers a pattern of the trimming material layer vertically through a set of layers within the alternating stack to form stepped surfaces, and each trimming process isotropically trims the trimming material layer. Each set of staircase-forming processing steps can include a third step of removing a remaining portion of the trimming material layer.

Figure 8A:
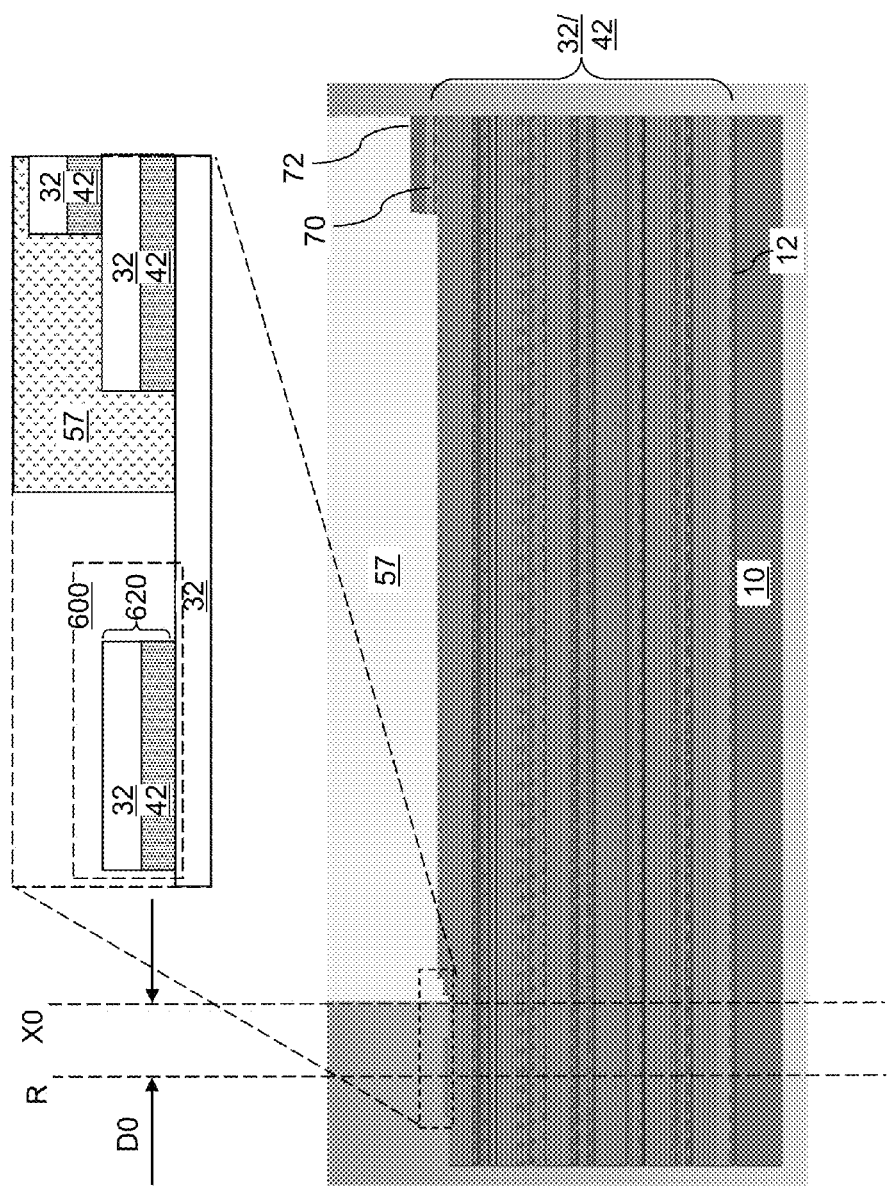
FIGS. 8A-8D are sequential schematic vertical cross-sectional views of the terrace region during formation of a terrace according to the second embodiment of the present disclosure.

Referring to FIG. 8A, a first step within the first set of staircase-forming processing steps in the same manner as in the corresponding processes of FIG. 6A. The structure of FIG. 8A differs from the structure of FIG. 6A in that the linear mark 600 includes a rail structure 620, i.e., a uniform (e.g., substantially uniform as permitted by lithography and etching) width strip, that includes a stack of patterned portions of an insulating layer 32 and a sacrificial material layer 42 that have vertically coincident sidewalls. As used herein, two surfaces are vertically coincident if there exists a vertical plane that includes the two surfaces. Such a vertical plane may, or may not, have a horizontal curvature, but does not include any curvature along the vertical direction, i.e., extends straight up and down.

The rail structure 620 extends along the second horizontal direction hd2. In one embodiment, a vertical plane (which is seen as a line in a top-down view) that passes through the geometrical center of the rail structure 620 and extending along the second horizontal direction hd2 can define a reference feature R from which an initial lateral offset D0 of a distal sidewall of the first trimming material layer 57 can be measured along the first horizontal direction hd1. The distal sidewall of the first trimming material layer 57 defines a vertical sidewall that defines the initial location X0 of the distal sidewall of the first trimming material layer 57 with respect to the reference feature R.

Figure 8B:
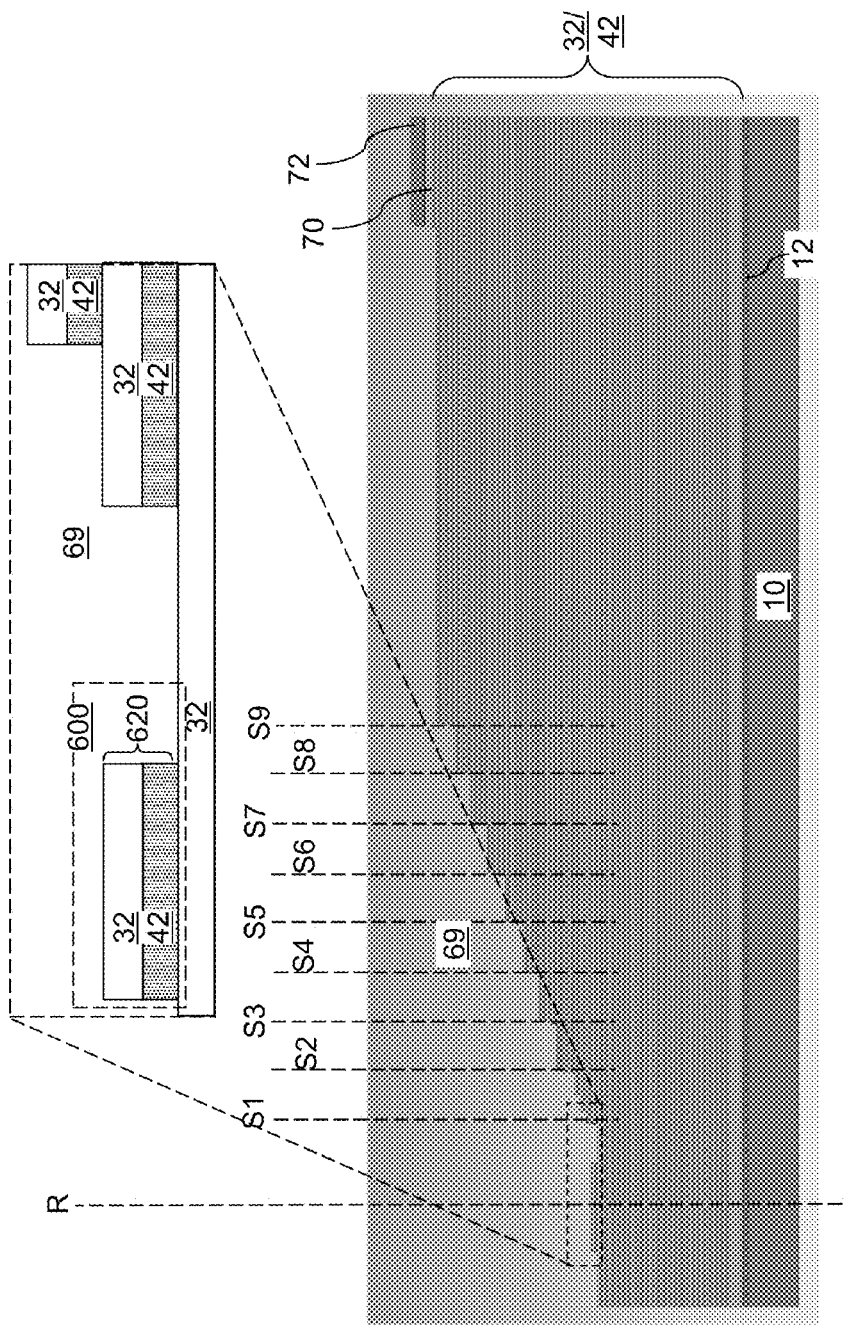

Referring to FIG. 8B, a second step within the first set of staircase-forming processing steps can be performed in the same manner as in the corresponding processes of FIG. 6B. The second step includes repetitions of a combination of an etch process and a trimming process. Each etch process transfers a pattern of the first trimming material layer 57 vertically through a set of layers within the alternating stack (32, 42) to form stepped surfaces. In one embodiment, each etch process transfers a pattern of the patterned first trimming material layer 57 vertically through one or more pairs of an insulating layer 32 and a sacrificial material layer 42. In case vertical steps along the second horizontal direction hd2 are formed during the processing steps of FIGS. 7A-7D, each etch process can transfer a respective pattern of the first trimming material layer 57 vertically through at least two insulating layers 32 and at least two spacer material layers 42 within the alternating stack (32, 42). Concurrently with transfer of the existing pattern outside the area covered by the first trimming material layer 57, a new pattern of vertical steps coinciding with the location of the trimmed sidewall of the first trimming material layer 57 is transferred through the upper portion of the alternating stack (32, 42). In addition, the linear mark 600 is transferred downward during each etch process within the first set of staircase-forming processing steps.

The locations of the vertical steps (S1-S9) can be measured during the second step as in the processing steps of FIG. 6B. As discussed above, the linear mark 600 facilitates measurement at multiple locations to generate a statistical distribution of measured values of the lateral offset distance.

After performing the last combination of the etch process and the trimming process within the second step, a third step of removing a remaining portion of the first trimming material layer 57 is performed to provide the structure of FIG. 8B.

Figure 8C:
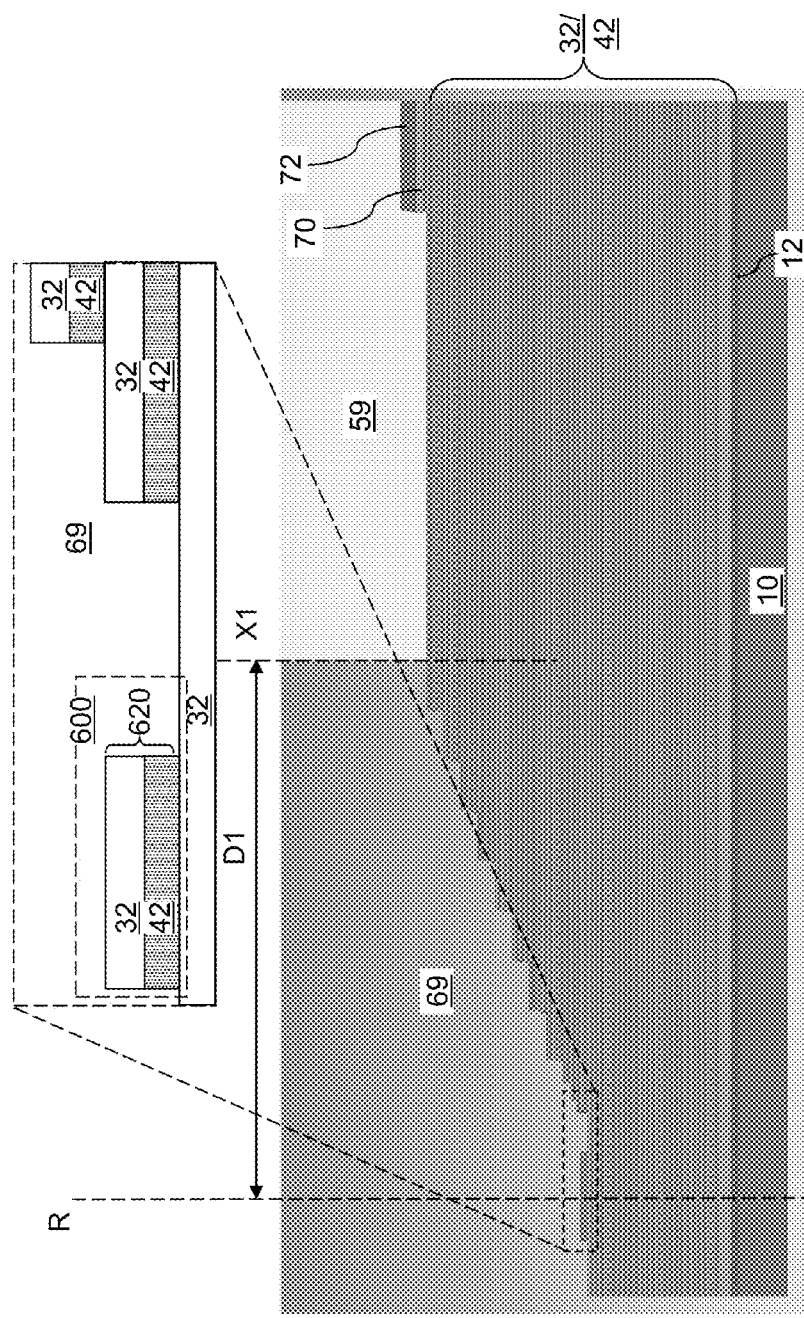

Referring to FIG. 8C, a second set of staircase-forming processing steps can be performed after the first set of staircase-forming processing steps is completed. The second set of staircase-forming processing steps can be identical to the first set of staircase-forming processing steps with the modification of the pattern for the second trimming material layer 59 with respect to the staircase pattern formed using the first trimming material layer 57. Specifically, a second trimming material layer 59 is applied over the exemplary structure, and is subsequently lithographically patterned to form a sidewall that is parallel to the second horizontal direction hd2.

The patterned second trimming material layer 59 covers the memory array region 100 and a proximal portion of each contact region 300, and does not cover the linear mark 600 or the patterned portion of the contact region 300 including the vertical steps (S1-S9). The distal sidewall of the second trimming material layer 59 defines a vertical sidewall that defines the initial location X1 of the distal sidewall of the second trimming material layer 59 with respect to the reference feature R.

Figure 8D:
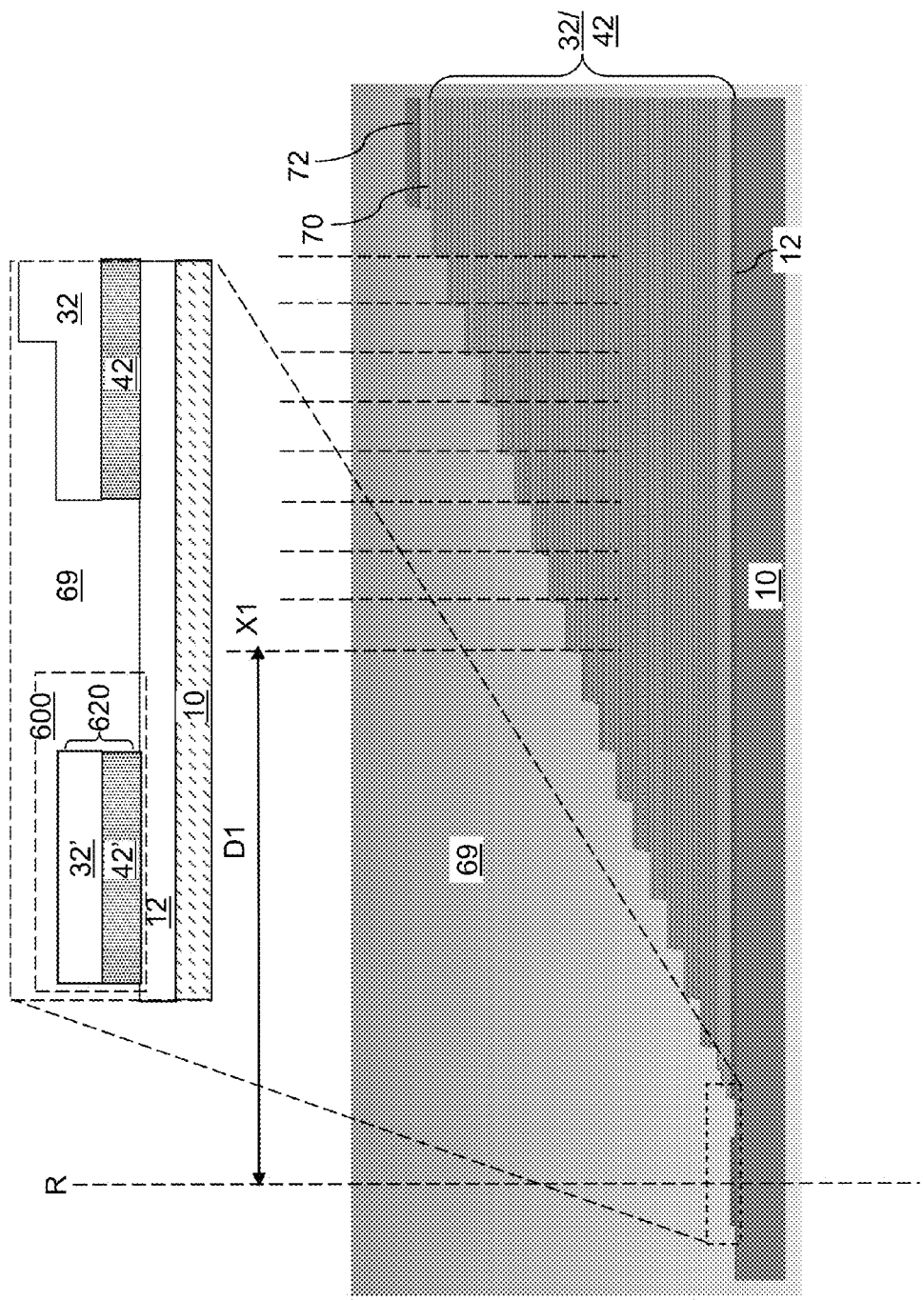

Referring to FIG. 8D, a second step within the second set of staircase-forming processing steps can be performed in the same manner as in the processing steps of FIG. 6D. The second step includes repetitions of a combination of an etch process and a trimming process. Each etch process transfers a pattern of the second trimming material layer 59 vertically through a set of layers within the alternating stack (32, 42) to form stepped surfaces. Each trimming process isotropically trims the second trimming material layer 59. The trimming distance during each trimming process can be the same as the lateral dimension of each step along the first horizontal direction. By repeatedly performing the combination of the etch process and the trimming process, additional steps are generated along the first horizontal direction hd1 within the contact region 300, and the stepped cavity 69 is laterally and vertically expanded.

In one embodiment, each etch process transfers a pattern of the patterned second trimming material layer 59 vertically through one or more pairs of an insulating layer 32 and a sacrificial material layer 42. In case vertical steps along the second horizontal direction hd2 are formed during the processing steps of FIGS. 7A-7D, each etch process can transfer a respective pattern of the second trimming material layer 59 vertically through at least two insulating layers 32 and at least two spacer material layers 42 within the alternating stack (32, 42). Concurrently with transfer of the existing pattern outside the area covered by the second trimming material layer 59, a new pattern of vertical steps coinciding with the location of the trimmed sidewall of the second trimming material layer 59 is transferred through the upper portion of the alternating stack (32, 42). In addition, the linear mark 600 is transferred downward during each etch process within the second set of staircase-forming processing steps.

The locations of the additional vertical steps can be measured during the second step as discussed above. The linear mark 600 facilitates measurement at multiple locations to generate a statistical distribution of measured values of the lateral offset distance. After performing the last combination of the etch process and the trimming process within the second step, a third step of removing a remaining portion of the second trimming material layer 59 is performed to provide the structure of FIG. 8D.

Additional set of staircase-forming processing steps can be performed until a terrace region including stepped surfaces is formed on the alternating stack (32, 42). The stepped surfaces can continuously extend from a bottommost layer within the alternating stack (32, 42) to a topmost layer within the alternating stack (32, 42) upon completion of the last set of staircase-forming processing steps. Each set of staircase-forming processing steps can have an identical set of processing steps as the first or second set of staircase-forming processing steps with appropriate modifications to the pattern of respective trimming material layers and other appropriate changes.

During the processing steps of FIGS. 8A-8D, the rail structure 620 is vertically transferred through various layers in the alternating stack (32, 42) during the etch processes, while maintaining the general shape of the rail structure 620. Even if the width of the rail structure 620 is changed during the pattern transfer, for example, by widening or narrowing of the rail structure 620, the location of the vertical plane passing through the geometrical center of the rail structure 620 and extending parallel to the second horizontal direction hd2 does not change. Thus, the location of the reference feature R remains invariant throughout the pattern transfer processes.

After the processing steps of FIGS. 8A-8D, the linear mark 600 can include a rail structure 620 that laterally extends along the second horizontal direction hd2 and vertically extends through a dielectric pad layer 12 underlying the alternating stack (32, 42). The rail structure 620 includes an isolated portion of the bottommost sacrificial material layer 42, which is herein referred to as a spacer dielectric portion 42'. The rail structure 620 can further include an isolated portion of the bottommost insulating layer, which is herein referred to as an insulating material portion 32'. The vertical sidewalls of the spacer dielectric portion 42' and the insulating material portion 32' are vertically coincident in the rail structure 620.

In one embodiment, the stepped surfaces in the terrace region can include top surfaces of each insulating layer 32 within the alternating stack (32, 42). In another embodiment, the stepped surfaces in the terrace region can include top surfaces of each sacrificial material layer 42 within the alternating stack (32, 42).

In one embodiment, a sidewall of the linear mark 600 is laterally spaced from a sidewall of a bottommost electrically conductive layer 46 to be subsequently formed within the alternating stack by a lateral distance that is in a range from 10% of an average lateral spacing between neighboring vertical steps of the terrace region and 300% of the average lateral spacing between neighboring vertical steps of the terrace region.

FIG. 9 illustrates a perspective view of a terrace region after formation of the stepped terraces employing the processing steps of FIGS. 7A-7D and 8A-8D according to the second embodiment of the present disclosure. The linear mark 600 includes a rail structure, which can be a stack of a portion of an insulating layer 32 and a portion of a sacrificial material layer 42 that have vertically coincident sidewalls that extend along the second horizontal direction.

In one embodiment, lateral offset distances between a subset of vertical surfaces within the stepped surfaces and the reference feature R can be measured while, and/or after the terrace region is formed as discussed above. In one embodiment, lateral offset distances between the sidewalls of the trimming material layers (57, 59) and the reference feature R can be measured while the terrace region is formed as discussed above. The direction of measurement (e.g., in the first horizontal direction hd1) with respect to the linear mark 600 is perpendicular to the local direction of the linear mark 600 (e.g., in the second horizontal direction hd2) as illustrated by bidirectional arrows in FIG. 10. It is understood that the measurements illustrated by the bidirectional arrows in FIG. 10 are only illustrative, and different sets of measurement locations can be selected as desired.

Figure 11:
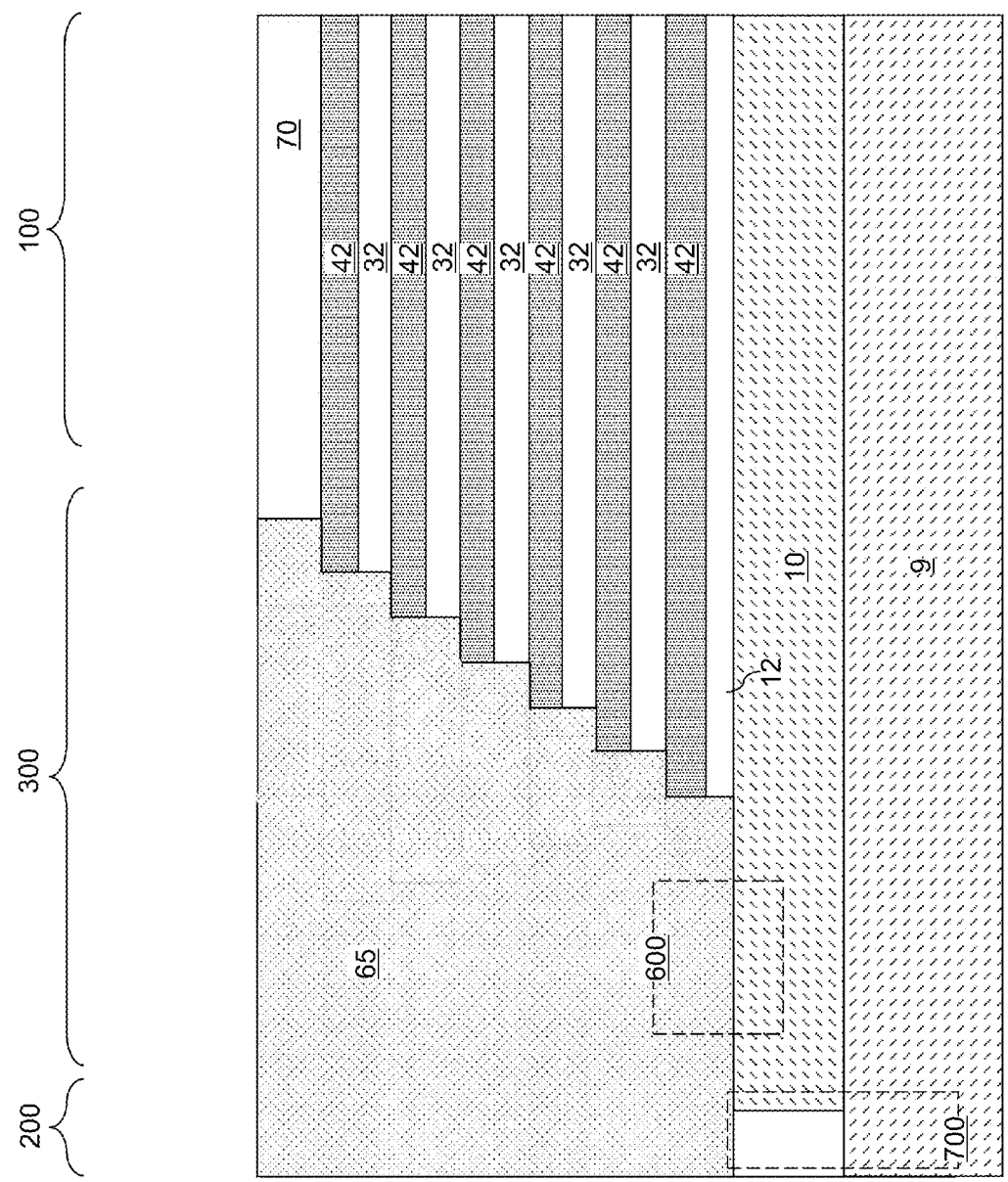
FIG. 11 is a schematic vertical cross-sectional view of the exemplary structure of FIG. 2 after formation of a retro-stepped dielectric material portion according to an embodiment of the present disclosure.

Referring to FIG. 11, subsequent processing steps can be performed to the first exemplary structure including instances of the stepped terraces of FIG. 6D or to the second exemplary structure including instances of the stepped terraces of FIG. 8D. Specifically, a retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the insulating cap layer 70 (and/or the sacrificial layer 72, if present), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIG. 12, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The array of memory openings 49 is formed in the memory array region 100. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Referring to FIG. 13A, a memory opening 49 in the exemplary device structure of FIG. 12 is illustrated. The memory opening 49 extends through the insulating cap layer 70, the alternating stack (32, 42), an optional dielectric cap layer 31, such as a silicon oxide layer, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 13B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 13C, a stack of layers including at least one blocking dielectric layer (501, 503), a charge storage layer 504, a tunneling dielectric layer 506, and an optional first semiconductor channel layer 601L can be sequentially deposited in the memory openings 49.

The at least one blocking dielectric layer (501, 503) can include a first blocking dielectric layer 501 and a second blocking dielectric layer 503. The first blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501 can be in a range from 1 nm to 20 nm, although lesser and greater thicknesses can also be employed. The first blocking dielectric layer 501 can subsequently function as a dielectric material portion that blocks leakage of stored electrical charges to control gate electrodes. In one embodiment, the first blocking dielectric layer 501 includes aluminum oxide.

The second blocking dielectric layer 503 can be formed on the first blocking dielectric layer 501. The second blocking dielectric layer 503 can include a dielectric material that is different from the dielectric material of the first blocking dielectric layer 501. In one embodiment, the second blocking dielectric layer 503 can include silicon oxide, a dielectric metal oxide having a different composition than the first blocking dielectric layer 501, silicon oxynitride, silicon nitride, or a combination thereof. In one embodiment, the second blocking dielectric layer 503 can include silicon oxide. The second blocking dielectric layer 503 can be formed by a conformal deposition method such as low pressure chemical vapor deposition, atomic layer deposition, or a combination thereof. The thickness of the second blocking dielectric layer 503 can be in a range from 1 nm to 20 nm, although lesser and greater thicknesses can also be employed. Alternatively, the first blocking dielectric layer 501 and/or the second blocking dielectric layer 503 can be omitted, and a blocking dielectric layer can be formed after formation of backside recesses on surfaces of memory films to be subsequently formed.

Subsequently, the charge storage layer 504 can be formed. In one embodiment, the charge storage layer 504 can be a continuous layer or patterned discrete portions of a charge trapping material including a dielectric charge trapping material, which can be, for example, silicon nitride. Alternatively, the charge storage layer 504 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 504 includes a silicon nitride layer. In one embodiment, the sacrificial material layers 42 and the insulator layers 32 can have vertically coincident sidewalls, and the charge storage layer 504 can be formed as a single continuous layer.

In another embodiment, the sacrificial material layers 42 can be laterally recessed with respect to the sidewalls of the insulator layers 32, and a combination of a deposition process and an anisotropic etch process can be employed to form the charge storage layer 504 as a plurality of memory material portions that are vertically spaced apart. While the present disclosure is described employing an embodiment in which the charge storage layer 504 is a single continuous layer, embodiments are expressly contemplated herein in which the charge storage layer 504 is replaced with a plurality of memory material portions (which can be charge trapping material portions or electrically isolated conductive material portions) that are vertically spaced apart.

The charge storage layer 504 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 504 may comprise an insulating charge trapping material, such as one or more silicon nitride segments. Alternatively, the charge storage layer 504 may comprise conductive nanoparticles such as metal nanoparticles, which can be, for example, ruthenium nanoparticles. The charge storage layer 504 can be formed, for example, by chemical vapor deposition (CVD), atomic layer deposition (ALD), physical vapor deposition (PVD), or any suitable deposition technique for storing electrical charges therein. The thickness of the charge storage layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501, 503, 504, 506, 601L).

Referring to FIG. 13D, the optional first semiconductor channel layer 601L, the tunneling dielectric layer 506L, the charge storage layer 504, the at least one blocking dielectric layer (501, 503) are sequentially anisotropically etched employing at least one anisotropic etch process. The portions of the first semiconductor channel layer 601, the tunneling dielectric layer 506, the charge storage layer 504, and the at least one blocking dielectric layer (501, 503) located above the top surface of the insulating cap layer 70 can be removed by the at least one anisotropic etch process. Further, the horizontal portions of the first semiconductor channel layer 601L, the tunneling dielectric layer 506, the charge storage layer 504, and the at least one blocking dielectric layer (501, 503) at a bottom of each cavity 49' can be removed to form openings in remaining portions thereof. Each of the first semiconductor channel layer 601L, the tunneling dielectric layer 506, the charge storage layer 504, and the at least one blocking dielectric layer (501, 503) can be etched by anisotropic etch process.

Each remaining portion of the first semiconductor channel layer 601L constitutes a first semiconductor channel portion 601. The charge storage layer 504 can comprise a charge trapping material or a floating gate material. In one embodiment, each charge storage layer 504 can include a vertical stack of charge storage regions that store electrical charges upon programming. In one embodiment, the charge storage layer 504 can be a charge storage layer in which each portion adjacent to the sacrificial material layers 42 constitutes a charge storage region. Each remaining portion of the second blocking dielectric layer 503 is herein referred to as a second blocking dielectric layer 503. Each remaining portion of the first blocking dielectric layer 501 is herein referred to as a first blocking dielectric layer 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 506, the charge storage layer 504, and the at least one blocking dielectric layer (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 506 is located over the charge storage layer 504. A set of at least one blocking dielectric layer (501, 503), a charge storage layer 504, and a tunneling dielectric layer 506 in a memory opening 49 constitutes a memory film 50, which includes a plurality of charge storage regions (as embodied as the charge storage layer 504) that are insulated from surrounding materials by the at least one blocking dielectric layer (501, 503) and the tunneling dielectric layer 506. In one embodiment, the first semiconductor channel portion 601, the tunneling dielectric layer 506, the charge storage layer 504, the second blocking dielectric layer 503, and the first blocking dielectric layer 501 can have vertically coincident sidewalls.

Referring to FIG. 13E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 13F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 13G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 506 is surrounded by a charge storage layer 504, and laterally surrounds a portion of the semiconductor channel 60. Each adjoining set of a first blocking dielectric layer 501, a second blocking dielectric layer 503, a charge storage layer 504, and a tunneling dielectric layer 506 collectively constitute a memory film 50, which can store electrical charges with a macroscopic retention time. In some embodiments, a first blocking dielectric layer 501 and/or a second blocking dielectric layer 503 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 13H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 14:
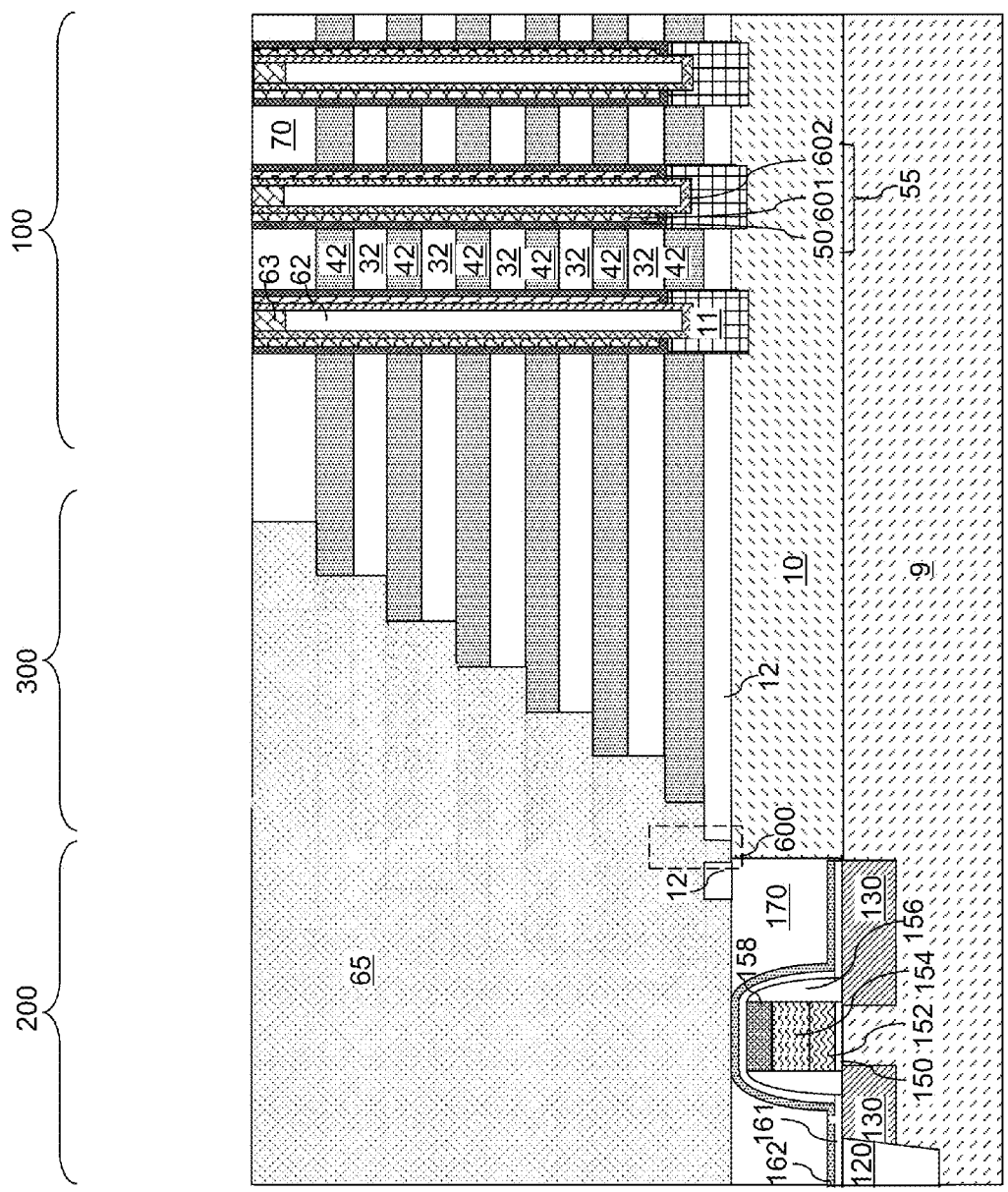
FIG. 14 is a schematic vertical cross-sectional view of the exemplary structure after formation of memory stack structures according to an embodiment of the present disclosure.

The exemplary memory stack structure 55 can be embedded into the exemplary structure illustrated in FIG. 12. FIG. 14 illustrates the exemplary structure that incorporates multiple instances of the exemplary memory stack structure of FIG. 13H. Each exemplary memory stack structure 55 includes a semiconductor channel 60 which may comprise layers (601, 602) and a memory film 50. The memory film 50 may comprise a tunneling dielectric layer 506 laterally surrounding the semiconductor channel 60 and a vertical stack of charge storage regions laterally surrounding the tunneling dielectric layer 506 (as embodied as a memory material layer 504) and an optional blocking dielectric (e.g., 501, 503). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a first blocking dielectric layer 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 15A:
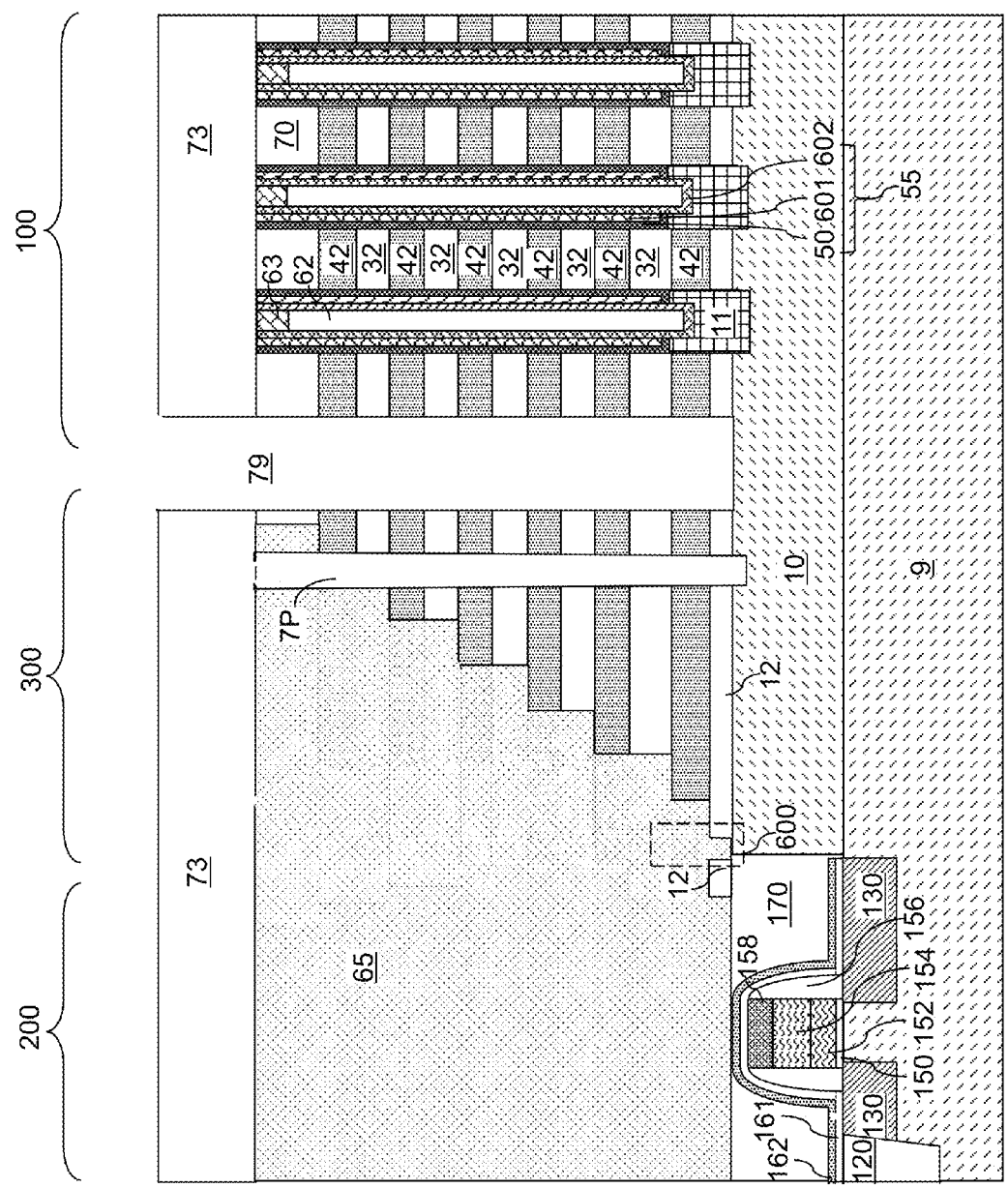
FIG. 15A is a schematic vertical cross-sectional view of the exemplary structure after formation of a backside trench according to an embodiment of the present disclosure.

Referring to FIGS. 15A and 15B, at least one dielectric support pillar 7P may be optionally formed through the retro-stepped dielectric material portion 65 and/or through the insulating cap layer 70 and/or through the alternating stack (32, 42). The plane A-A' in FIG. 15B corresponds to the plane of the schematic vertical cross-sectional view of FIG. 15A. In one embodiment, the at least one dielectric support pillar 7P can be formed in the contact region 300, which is located adjacent to the memory array region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 16:
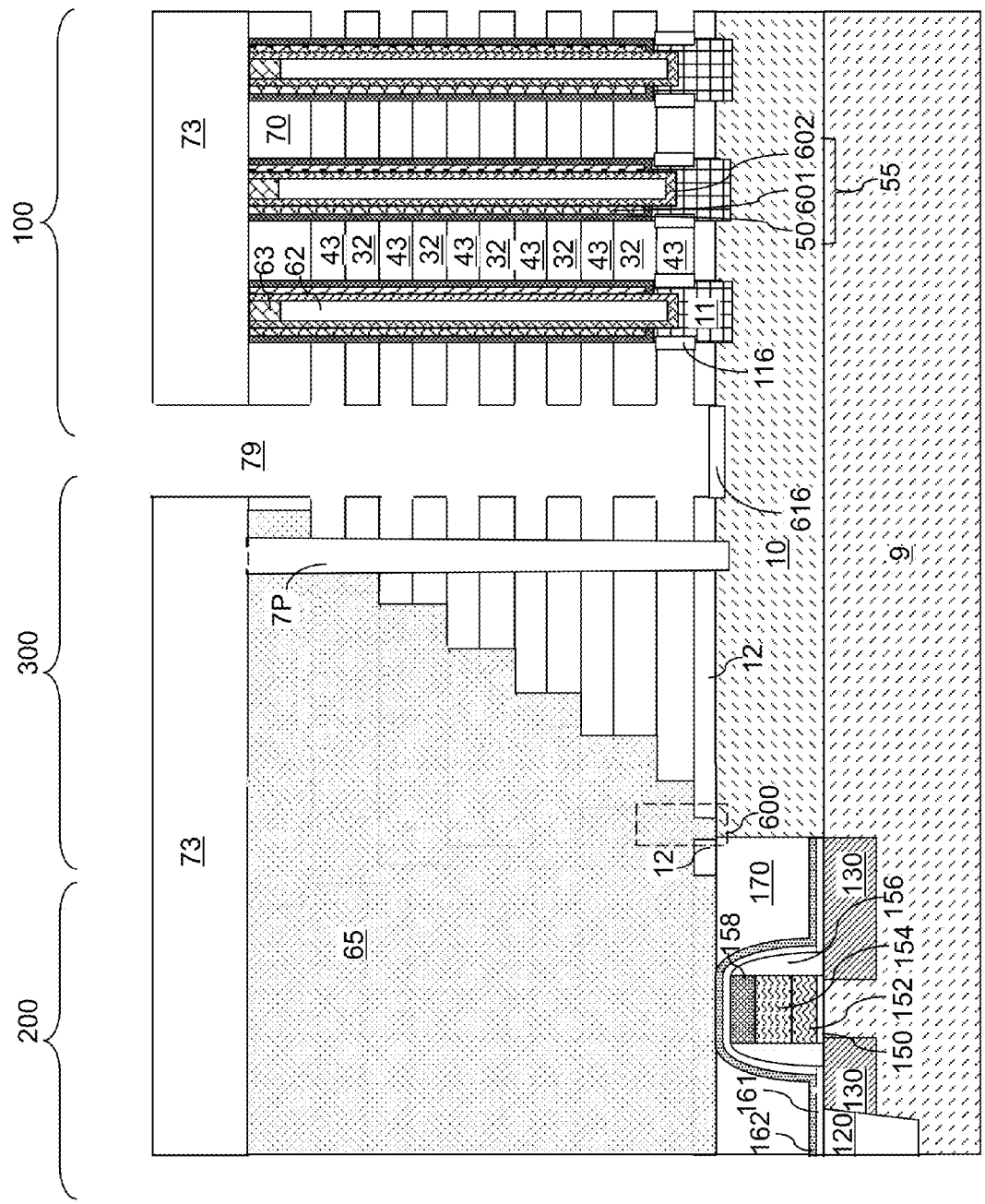
FIG. 16 is a schematic vertical cross-sectional view of the exemplary structure after formation of backside recesses according to an embodiment of the present disclosure.

Referring to FIG. 16, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the dielectric pad layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer 10 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 17:
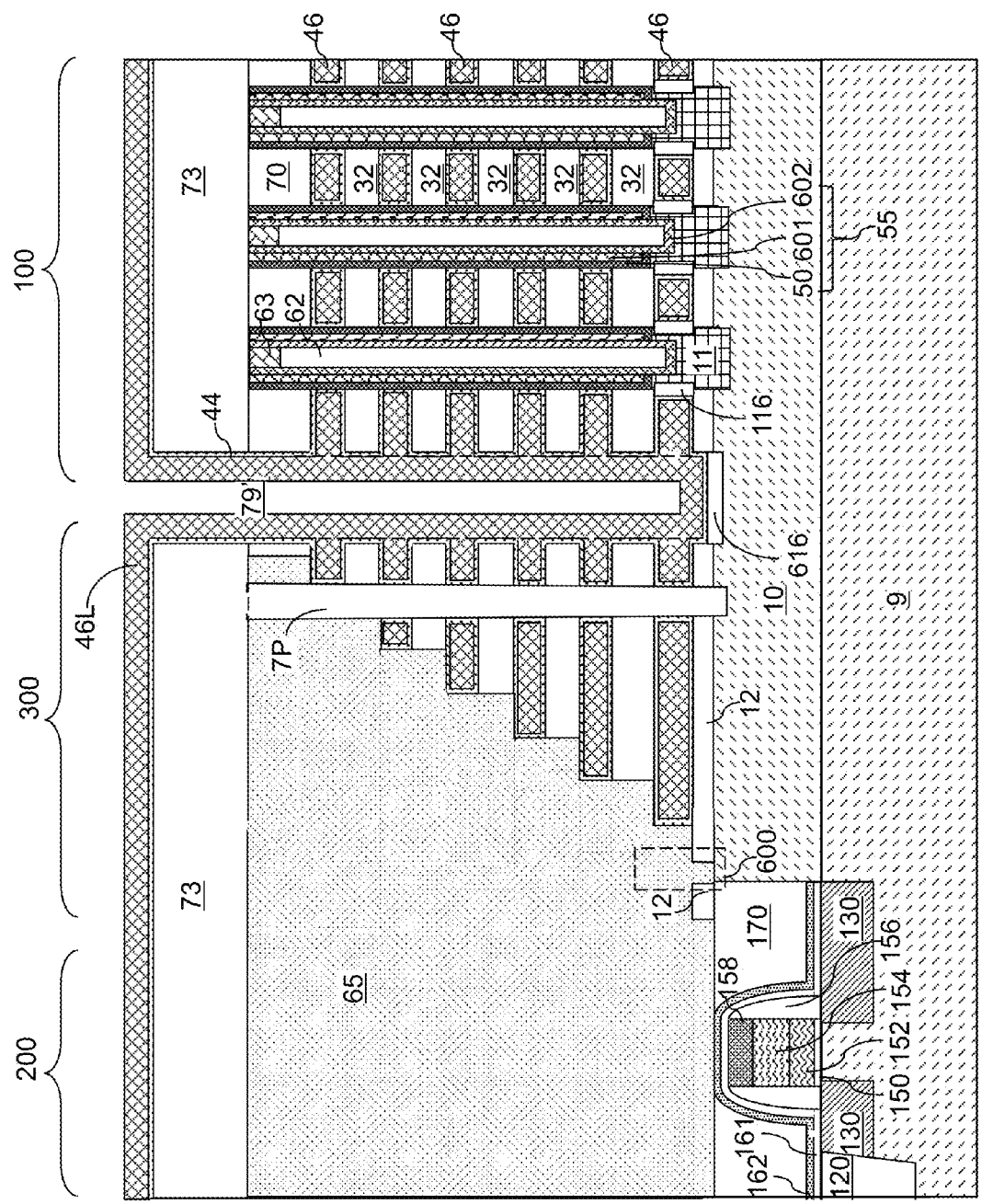
FIG. 17 is a schematic vertical cross-sectional view of the exemplary structure after formation of electrically conductive layers according to an embodiment of the present disclosure.

Referring to FIG. 17, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer (501, 503) is present within each memory opening, the backside blocking dielectric layer is optional. In case the blocking dielectric layer (501, 503) is omitted, the backside blocking dielectric layer is present.

The backside blocking dielectric layer 44 can be formed in the backside recesses 43 and on a sidewall of the backside contact trench 79. If the backside blocking dielectric layer 44 is formed, formation of the dielectric spacers 116 and the sacrificial dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the sacrificial dielectric portion 616. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A dielectric spacer 116 laterally surrounds a semiconductor portion that underlies the lower doped semiconductor portion (e.g., portion 11), wherein one of the electrically conductive layers laterally surrounds the dielectric spacer upon formation of the electrically conductive layers.

Figure 18:
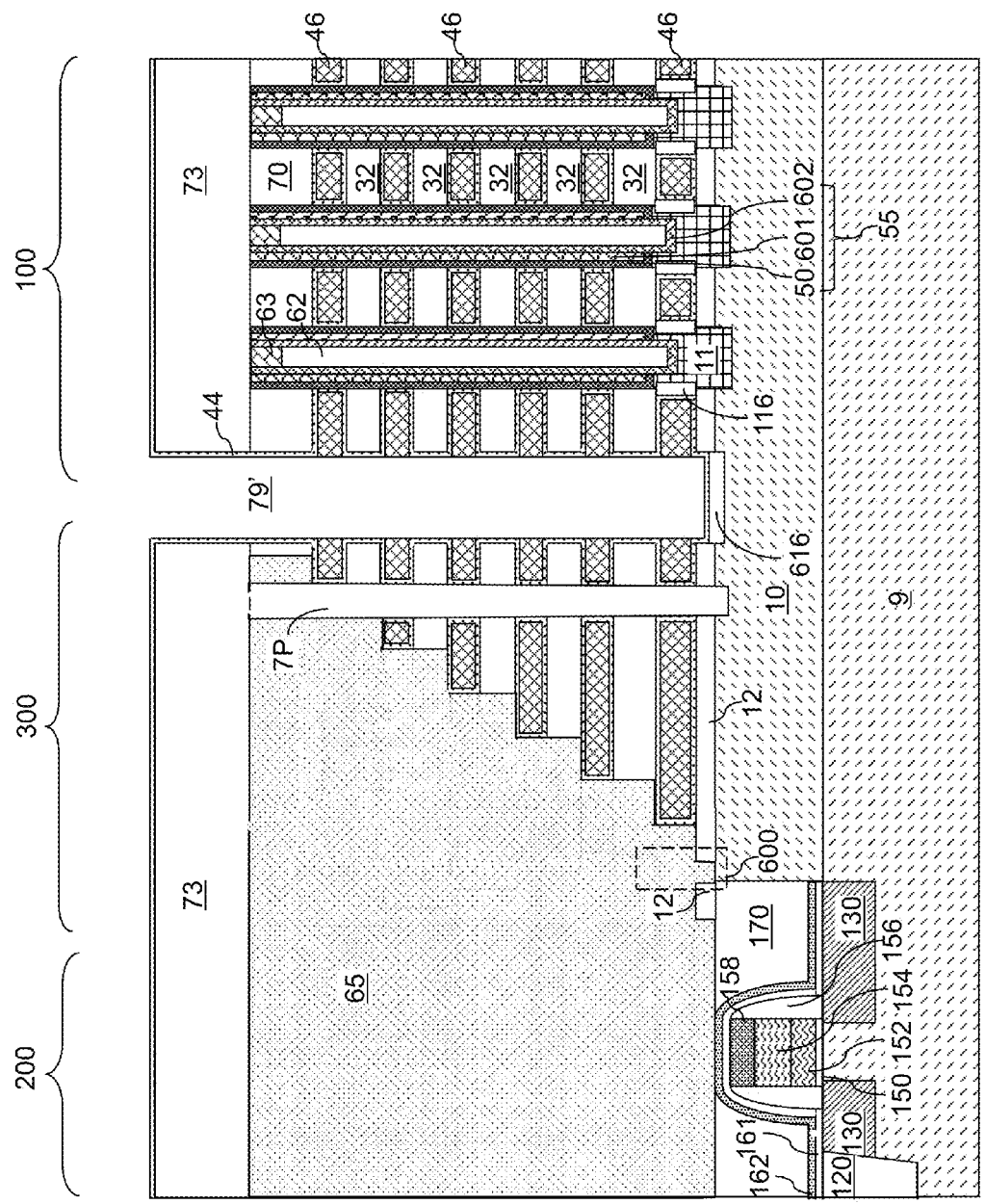
FIG. 18 is a schematic vertical cross-sectional view of the exemplary structure after removal of a deposited conductive material from within the backside trench according to an embodiment of the present disclosure.

Referring to FIG. 18, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 19:
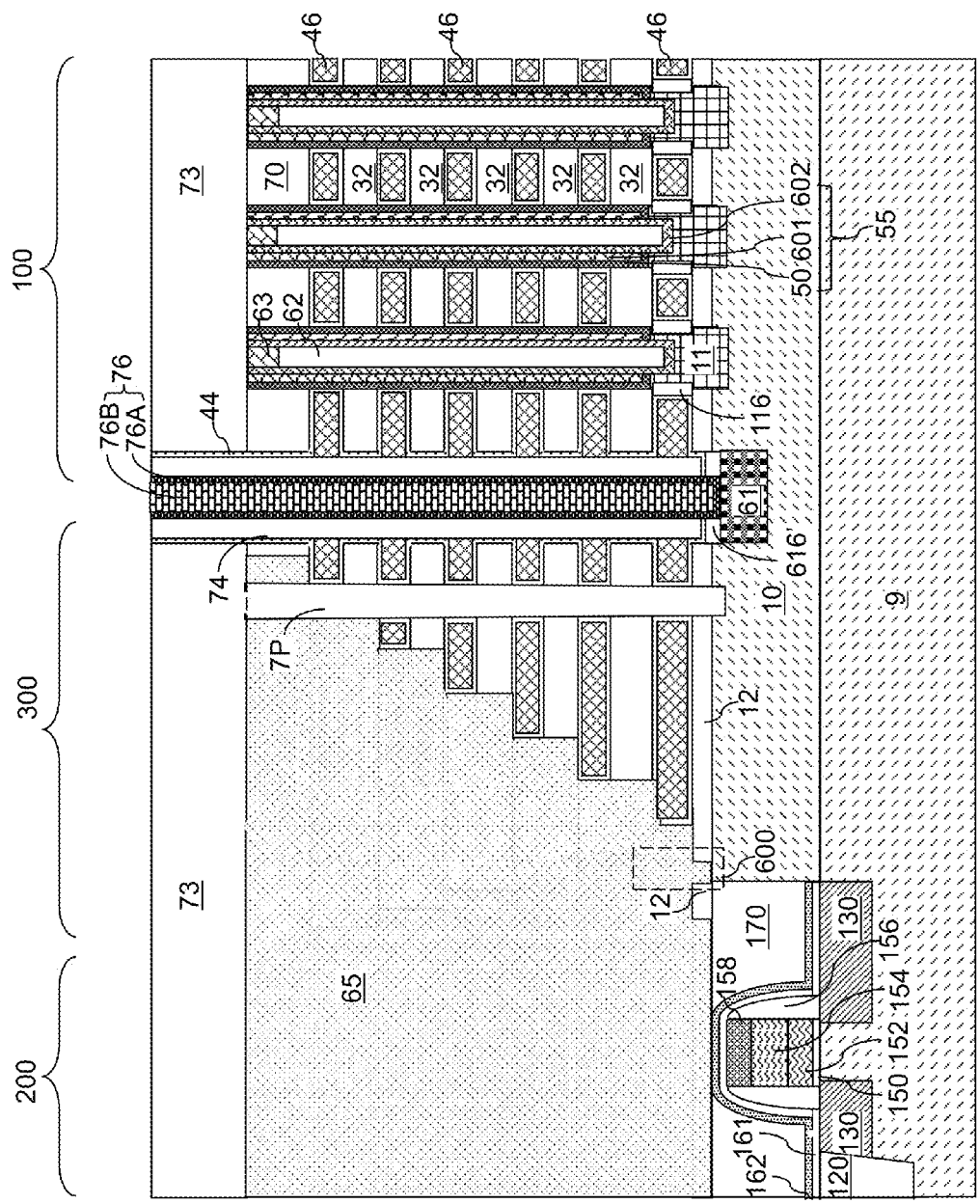
FIG. 19 is a schematic vertical cross-sectional view of the exemplary structure after formation of an insulating spacer and a backside contact structure according to an embodiment of the present disclosure.

Referring to FIG. 19, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the contact level dielectric layer 73 and at the bottom of each backside contact trench 79. Each remaining portion of the insulating material layer constitutes an insulating spacer 74.

A source region 61 can be formed at the bottom of each cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74.

Referring to FIG. 19, a contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each contact via structure 76 can be formed directly on a top surface of a source region 61.

Figure 20:
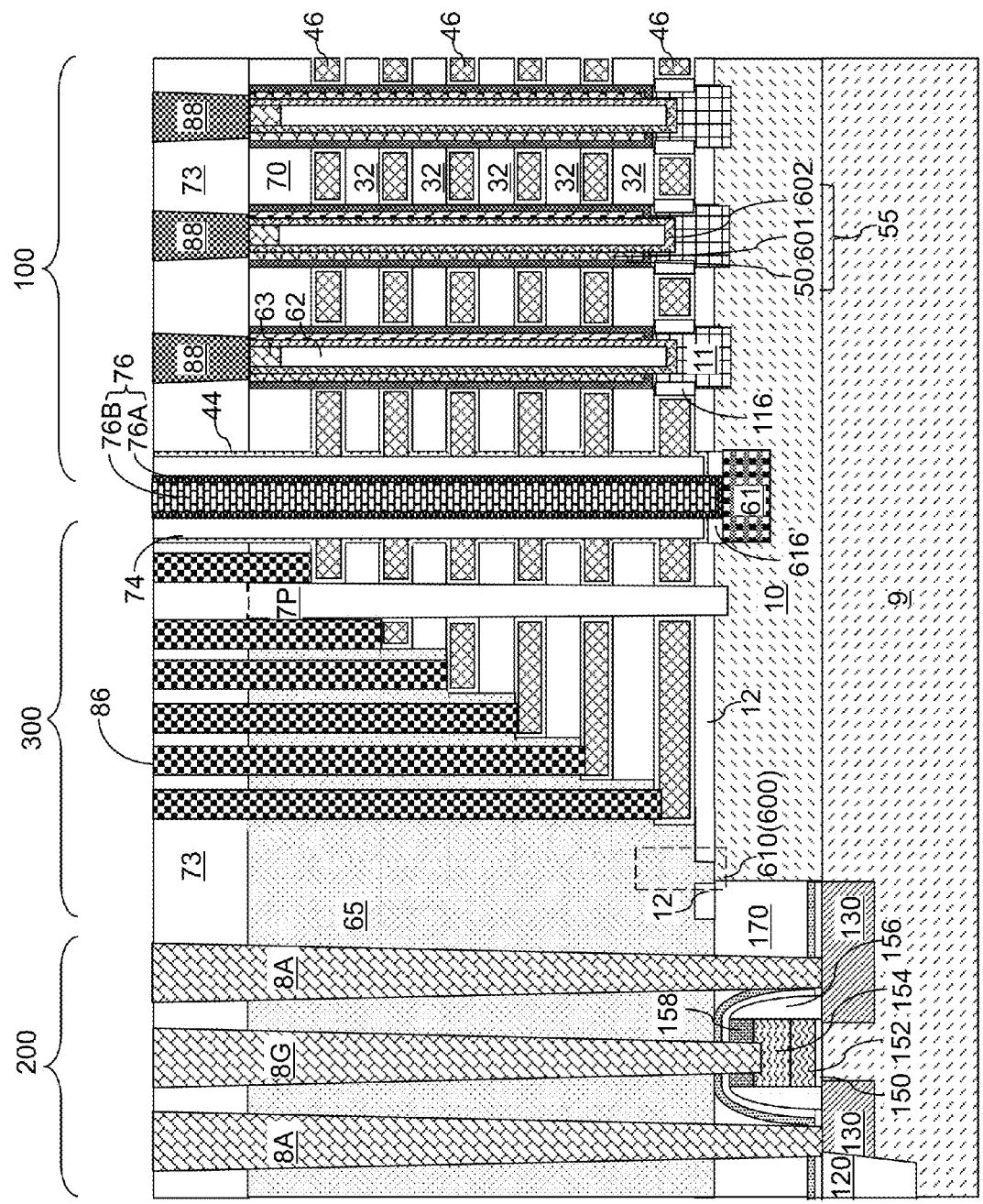
FIG. 20 is a schematic vertical cross-sectional view of the exemplary structure after formation of additional contact via structures according to an embodiment of the present disclosure.

Referring to FIG. 20, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices. The exemplary structure of FIG. 20 includes the linear mark 600 illustrated in FIG. 6D.

Figure 21:
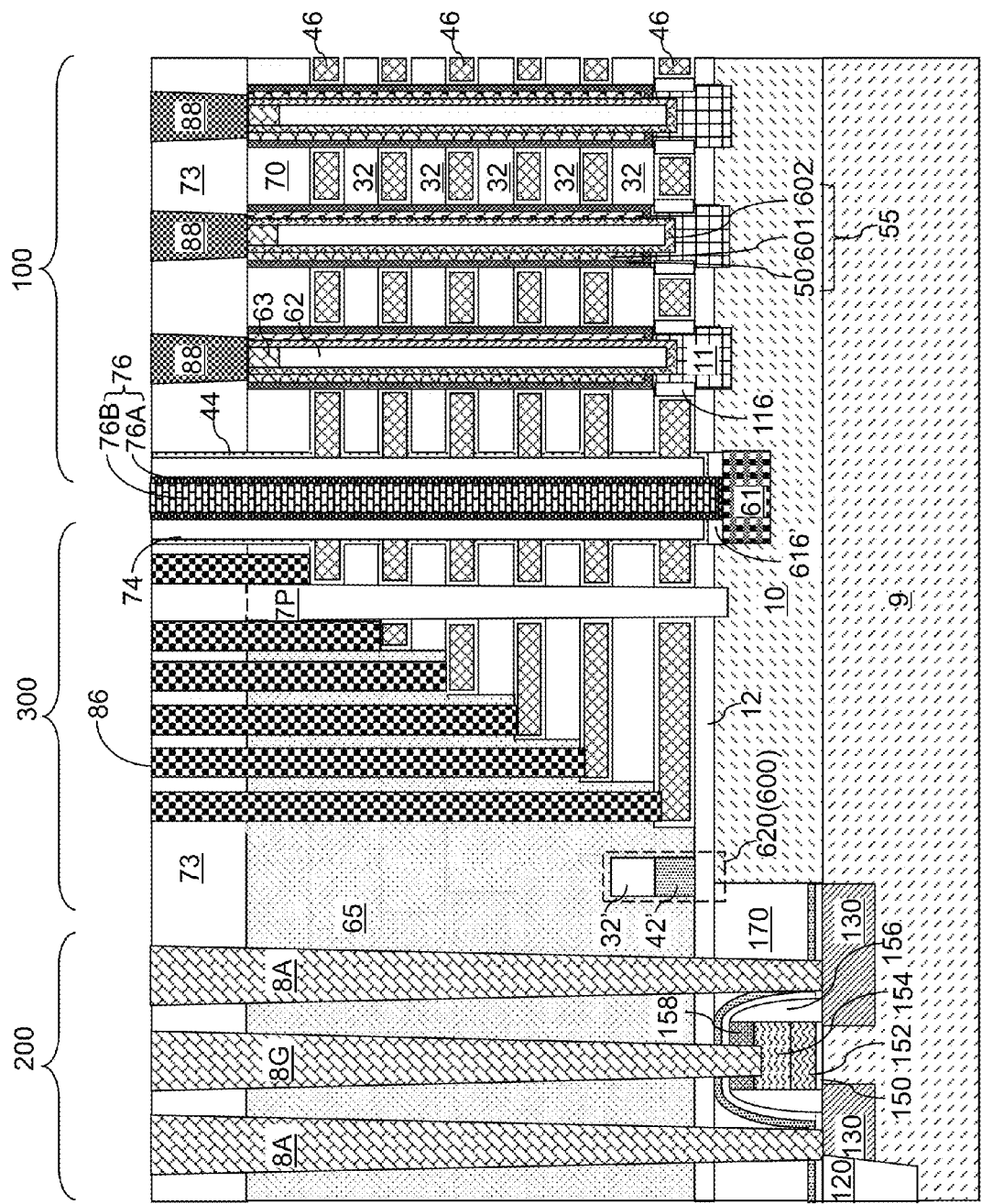
FIG. 21 is a schematic vertical cross-sectional view of an alternate embodiment of the exemplary structure of FIG. 20 according to an embodiment of the present disclosure.

Referring to FIG. 21, an alternate embodiment of the exemplary structure according to a second embodiment of the present disclosure can be derived from the exemplary structure of FIG. 20 by forming the rail shaped linear mark 620 of the type illustrated in FIGS. 8D and 9 in lieu of the trench shaped linear mark 610 illustrated in FIGS. 4 and 6D.

The exemplary structures of the present disclosure can include a three-dimensional memory device. The three-dimensional memory device includes an alternating stack of insulating layers 32 and electrically conductive layers 46 located over a substrate (9, 10), wherein the alternating stack (32, 46) comprises a terrace region in which each electrically conductive layer 46 other than a topmost electrically conductive layer 46 laterally extends farther than any overlying electrically conductive layers 46 within the alternating stack (32, 46), and the terrace region includes stepped surfaces that continuously extend from a bottommost layer within the alternating stack (32, 46) to a topmost layer within the alternating stack (32, 46); memory stack structures 55 extending through the alternating stack (32, 46), each of the memory stack structures 55 comprising a vertical stack of memory elements (as embodied, for example, by portions of the memory material layer 54 located at each level of the electrically conductive layers 46), a tunneling dielectric 56, and a vertical semiconductor channel 60; and a linear mark 600 (as embodied as a linear trench 610 illustrated in FIG. 20 or as a rail structure 620 illustrated in FIG. 21) that laterally extends perpendicular to a first horizontal direction hd1 and parallel to a second horizontal direction hd2, having a uniform width along the first direction hd1, and is laterally offset from a bottommost electrically conductive layer 46 toward an opposite side of the memory stack structures 55 in the memory array region 100 (such as toward a peripheral device region 200).

In one embodiment, stepped surfaces in the terrace region include top surfaces of each electrically conductive layer 46 within the alternating stack (32, 46). In another embodiment, stepped surfaces in the terrace region include top surfaces of each insulating layer 32 within the alternating stack (32, 46).

In one embodiment, the linear mark 600 comprises a trench pattern 610 that laterally extends along the second horizontal direction hd2 and vertically extends through a dielectric pad layer 12 underlying the alternating stack (32, 46) as illustrated in FIG. 20.

In another embodiment, the linear mark 600 comprises a rail structure 620 that laterally extends along the second horizontal direction hd2 and including a stack of a spacer dielectric portion 42' (which is an isolated portion of the bottommost sacrificial material layer 42) located at a same level as a bottommost electrically conductive layer 46 within the alternating stack and an insulating material portion 32' located at the same level as the bottommost insulating layer 32 and having the same composition as the bottommost insulating layer 32. The insulating material portion 32' and the bottommost insulating layer 32 are laterally spaced from each other along the first horizontal direction by a uniform distance. In one embodiment, wherein sidewalls of the spacer dielectric portion 42' are vertically coincident with sidewalls of the insulating material portion 32'.

In one embodiment, each of the memory stack structures 55 comprises, from outside to inside, a vertical stack of memory elements (as embodied, for example, as portions of the memory material layer 54 located at the levels of the electrically conductive layers 46), a tunneling dielectric 56, and a vertical semiconductor channel 60, and the electrically conductive layers 46 can comprise word lines for the vertical stack of memory elements 55.

In one embodiment, the three-dimensional memory device comprises a vertical NAND device located over the substrate (9, 10); the electrically conductive layers 46 comprise, or are electrically connected to, a respective word line of the NAND device; the substrate (9, 10) comprises a silicon substrate; the vertical NAND device comprises an array of monolithic three-dimensional NAND strings over the silicon substrate; at least one memory cell in a first device level of the array of monolithic three-dimensional NAND strings is located over another memory cell in a second device level of the array of monolithic three-dimensional NAND strings; and the silicon substrate contains an integrated circuit comprising a driver circuit for the memory device located thereon. The array of monolithic three-dimensional NAND strings can comprise: a plurality of semiconductor channels (60, 11, and a surface portion of the semiconductor material layer between the source region 61 and the epitaxial channel portions 11), wherein at least one end portion of each of the plurality of semiconductor channels extends substantially perpendicular to a top surface of the substrate (9, 10); a plurality of charge storage elements, each charge storage element located adjacent to a respective one of the plurality of semiconductor channels; and a plurality of control gate electrodes having a strip shape extending substantially parallel to the top surface of the substrate (9, 10), (for example, along the first horizontal direction), the plurality of control gate electrodes comprise at least a first control gate electrode located in the first device level and a second control gate electrode located in the second device level.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device structure, comprising:
   forming an alternating stack of insulating layers and spacer material layers over a substrate;
   forming a linear mark through a set of layers located at an upper portion of the alternating stack, wherein the linear mark laterally extends perpendicular to a first horizontal direction and parallel to a second horizontal direction;
   forming a vertical step providing a height difference corresponding to a pair of an insulating layer and a spacer material layer in the alternating stack and extending along the first horizontal direction concurrently with formation of the linear mark through the set of layers located at the upper portion of the alternating stack; and sequentially performing multiple sets of staircase-forming processing steps, wherein each set of the multiple sets of staircase-forming processing steps comprises:

a first step of forming a trimming material layer having a sidewall that is laterally offset from the linear mark by a respective substantially uniform lateral offset distance, the respective substantially uniform lateral offset distance increasing in each subsequent set of staircase-forming processing steps thereby increasing a respective area of patterning in each subsequent set of staircase-forming processing steps;

a second step of repeatedly performing a combination of an etch process and a trimming process, wherein each etch process transfers a pattern of the trimming material layer vertically through a set of layers within the alternating stack to form stepped surfaces, and each trimming process isotropically trims the trimming material layer thereby reducing a lateral extent of the trimming material layer and a pattern of an area covered by the trimming material layer, wherein a new pattern of vertical steps coinciding with a location of a trimmed sidewall of the trimming material layer is transferred into a respective remaining portion of the alternating stack by each etch process that follows a trimming process, and repetition of the combination of the etch process and the trimming process forms stepped surfaces of a respective subset of the insulating layers and the spacer material layers within the alternating stack in each set of staircase-forming processing steps; and a third step of removing a remaining portion of the trimming material layer, wherein each etch process transfers a respective pattern of the trimming material layer vertically through at least two insulating layers and at least two spacer material layers within the alternating stack while the linear mark is above a bottommost layer in the alternating stack; and wherein a measurement step for measuring at least one physical lateral offset distance between a vertical step of the stepped surfaces and the linear mark along the first horizontal direction is performed during the second step, and an amount of subsequent trimming of the trimming material layer is controlled based on measured data on the physical lateral offset distance between the vertical step of the stepped surfaces and the linear mark.

2. The method of claim 1, wherein the linear mark is transferred downward during each etch process within each set of staircase-forming processing steps while the linear mark is above a bottommost layer in the alternating stack.

3. The method of claim 1, wherein the at least one physical lateral offset distance comprises a plurality of physical offset distances that are measured at different locations that are spaced apart along the second horizontal direction.

4. The method of claim 1, wherein the at least one physical lateral offset distance is measured between a line that passes through a geometrical center of the linear mark and extends along the second horizontal direction.

5. The method of claim 1, wherein each etch process transfers a pattern of a respective patterned trimming material layer vertically through one or more pairs of an insulating layer and a sacrificial material layer.

6. The method of claim 1, wherein a terrace region including stepped surfaces, as formed by the stepped surfaces in a last set of staircase-forming processing steps among the multiple sets of staircase-forming processing steps, is formed on the alternating stack, wherein the stepped surfaces continuously extend from a bottommost layer within the alternating stack to a topmost layer within the alternating stack.

7. The method of claim 1, wherein the linear mark comprises a trench pattern that laterally extends along the second horizontal direction and vertically extends through at least one layer within the alternating stack or a dielectric pad layer underlying the alternating stack.

8. The method of claim 1, wherein the linear mark comprises a rail structure that comprises a patterned portion of the alternating stack and laterally extends along the second horizontal direction and vertically protrudes upward with respect to portions of the alternating stack that are adjacent to the linear mark.

9. The method of claim 1, further comprising:
forming memory openings through the alternating stack;
forming memory stack structures in the memory openings, each of the memory stack structures comprising a charge storage layer, a tunneling dielectric, and a vertical semiconductor channel;
replacing the spacer material layers with electrically conductive layers which comprise word lines; and
forming respective word line contact via structures in contact with the respective word lines in a contact region containing the stepped surfaces.

* * * * *